(12) United States Patent
Tullberg et al.

(10) Patent No.: US 12,273,194 B2
(45) Date of Patent: Apr. 8, 2025

(54) ITERATIVE GUESSING RANDOM ADDITIVE NOISE DECODING (GRAND) IN THE PRESENCE OF BURSTY CHANNELS

(71) Applicant: Telefonaktiebolaget LM Ericsson (publ), Stockholm (SE)

(72) Inventors: Hugo Tullberg, Nyköping (SE); Guido Carlo Ferrante, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 18/563,102

(22) PCT Filed: Oct. 20, 2021

(86) PCT No.: PCT/SE2021/051043
§ 371 (c)(1),
(2) Date: Nov. 21, 2023

(87) PCT Pub. No.: WO2023/068973
PCT Pub. Date: Apr. 27, 2023

(65) Prior Publication Data
US 2024/0223306 A1    Jul. 4, 2024

(51) Int. Cl.
*H03M 13/00* (2006.01)
*H03M 13/27* (2006.01)
(Continued)

(52) U.S. Cl.
CPC .......... *H04L 1/0045* (2013.01); *H03M 13/27* (2013.01); *H03M 13/37* (2013.01); *H04L 1/0071* (2013.01)

(58) Field of Classification Search
None
See application file for complete search history.

(56) References Cited

U.S. PATENT DOCUMENTS 10,476,527 B2 * 11/2019 Ikegaya ............ H03M 13/1102
10,559,052 B1 * 2/2020 Reed .................... C09D 11/037
(Continued)

FOREIGN PATENT DOCUMENTS

WO        89/12933 A1    12/1989

OTHER PUBLICATIONS

Abbas, Syed Mohsin et al.; "High-Throughput VLSI Architecture for GRAND Markov Order"; 2021 IEEE Workshop on Signal Processing System (SIPS); Oct. 19, 2021; pp. 158-163 (6 pages); XP034018616.

(Continued)

*Primary Examiner* — Mujtaba M Chaudry
(74) *Attorney, Agent, or Firm* — Sage Patent Group

(57) ABSTRACT

A node performs iterative GRAND-burst discovery by generating a first stream of candidate codewords by deinterleaving a first stream of bits. The node determines a validity of a first bit of a first candidate codeword in the first stream of candidate codewords using GRAND, generates a second stream of bits by re-interleaving the first stream of candidate codewords, and determines whether a second bit in the second stream of bits is a potential error bit based on a location of the second bit relative to a location of the first bit in the second stream of bits and the validity of the first bit. The node generates a second stream of candidate codewords by deinterleaving the second stream of bits, and changes a value of a third bit of the second stream of candidate codewords based on whether the second bit is a potential error bit.

15 Claims, 16 Drawing Sheets

(51) Int. Cl.
*H03M 13/37* (2006.01)
*H04L 1/00* (2006.01)

(56) References Cited

U.S. PATENT DOCUMENTS

| | | | |
|---|---|---|---|
| 10,608,672 B2 | 3/2020 | Medard et al. | |
| 10,608,673 B2 | 3/2020 | Medard et al. | |
| 10,783,602 B1* | 9/2020 | Reed | G06T 1/0028 |
| 10,887,047 B2* | 1/2021 | Myung | H04L 1/0041 |
| 11,012,100 B2* | 5/2021 | Fazeli Chaghooshi | H03M 13/611 |
| 11,215,711 B2* | 1/2022 | Hilliges | G06T 19/006 |
| 11,381,258 B2* | 7/2022 | Cideciyan | H03M 13/2906 |
| 2013/0343495 A1* | 12/2013 | Han | H03M 13/6331 375/350 |
| 2018/0123615 A1 | 5/2018 | Varatkar et al. | |
| 2020/0186172 A1 | 6/2020 | Medard et al. | |

OTHER PUBLICATIONS

Riaz, Arslan et al.; "Multi-Code Multi-Rate Universal Maximum Likelihood Decoder using GRAND"; ESSCIRC 2021—IEEE 47th European Solid State Circuits Conference (ESSCIRC); Sep. 13, 2021; pp. 239-246 (8 pages); XP033993724.

Veresova, A. M. et al,; "About One Algorithm for Correcting Bursts Using Block-Permutation LDPC-Codes"; 2019 Wave Electronics and Its Application in Information and Telecommunication System (WECONF); IEEE; Jun. 3, 2019; pp. 1-4 (4 pages); XP033617643.

Lin, S. et al.; "Burst-Error-Correcting Codes"; Error Control Coding. Fundamentals and Applications; Jan. 1, 1983; Englewood Cliffs, Prentice Hall, US; pp. 257-269 (13 pages); XP002056640.

International Search Report and Written Opinion mailed Jun. 27, 2022 for PCT Application No. PCT/SE2021/051043, 19 pages.

Duffy, Ken R., et al.; "Capacity-Achieving Guessing Random Additive Noise Decoding"; IEEE Transactions on Information Theory, vol. 65, No. 7, Jul. 2019; pp. 4023-4040 (18 pages).

\* cited by examiner

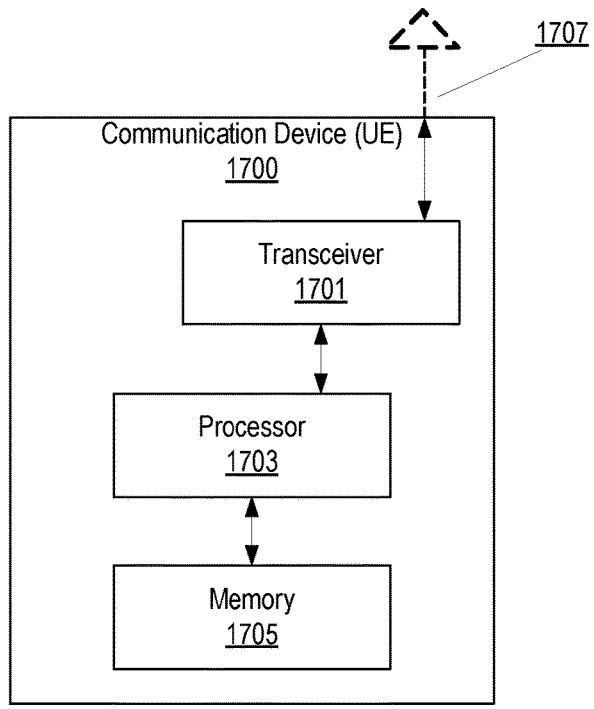
FIG. 17
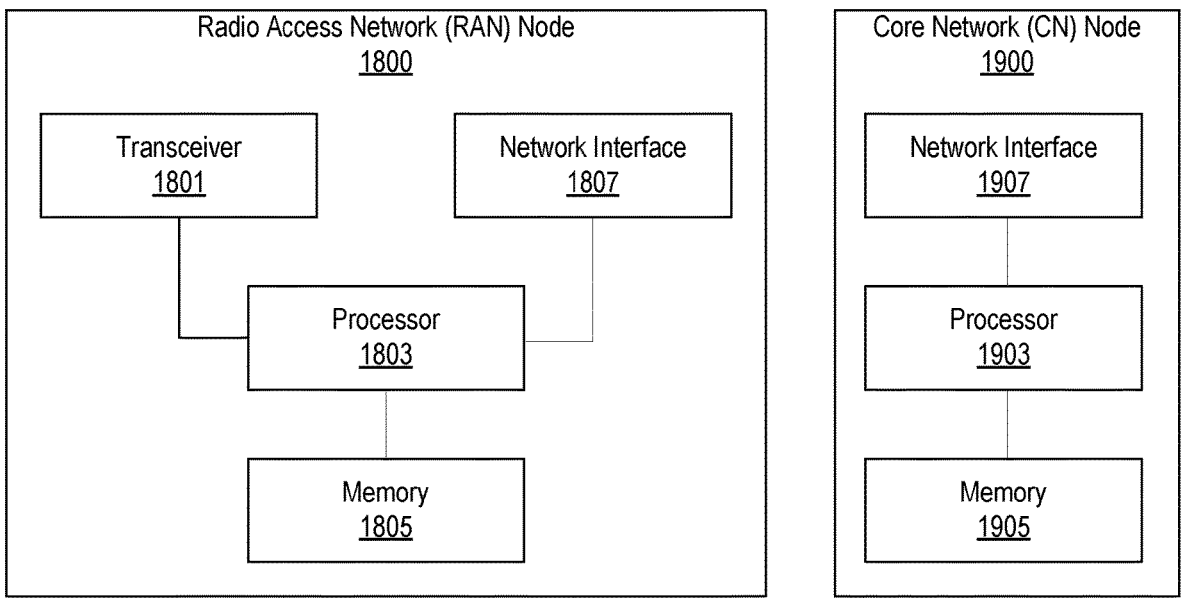
FIG. 18
FIG. 19

US 12,273,194 B2

ITERATIVE GUESSING RANDOM ADDITIVE NOISE DECODING (GRAND) IN THE PRESENCE OF BURSTY CHANNELS

CROSS-REFERENCE TO RELATED APPLICATIONS

This application is a 35 U.S.C § 371 national stage application for International Application No. PCT/SE2021/051043, entitled "ITERATIVE GUESSING RANDOM ADDITIVE NOISE DECODING (GRAND) IN THE PRESENCE OF BURSTY CHANNELS", filed on Oct. 20, 2021, assigned to the assignee hereof, and expressly incorporated herein by reference.

TECHNICAL FIELD

The present disclosure relates generally to communications, and more particularly to communication methods and related devices and nodes supporting wireless communications.

BACKGROUND

FIG. 1 illustrates an example of a new radio ("NR") network (e.g., a 5th Generation ("5G") network) including a 5G core ("5GC") network 130, network node 120 (e.g., 5G base station ("gNB")), multiple communication devices 110 (also referred to as user equipment ("UE")).

SUMMARY

According to some embodiments, a method performed by a first network node in a wireless communications network is provided. The method includes receiving a first stream of bits. The method further includes generating a first stream of candidate codewords by deinterleaving the first stream of bits. The method further includes determining a validity of a first bit of a first candidate codeword in the first stream of candidate codewords using guessing random additive noise decoding, GRAND. The method further includes, subsequent to determining the validity of the first bit of the first candidate codeword, generating a second stream of bits by re-interleaving the first stream of candidate codewords. The method further includes determining whether a second bit in the second stream of bits is a potential error bit based on a location of the second bit relative to a location of the first bit in the second stream of bits and the validity of the first bit. The method further includes, subsequent to determining whether the second bit is a potential error bit, generating a second stream of candidate codewords by deinterleaving the second stream of bits. The method further includes changing a value of a third bit of the second stream of candidate codewords based on whether the second bit is a potential error bit. The method further includes, subsequent to changing the value of the third bit, determining whether a second candidate codeword of the second stream of candidate codewords is within a threshold number of error bits from correct using GRAND. The second candidate codeword can include the third bit.

According to other embodiments, a first network node, a computer program, computer program code, and non-transitory computer-readable medium are provided to perform the methods above.

Various embodiments herein, provide one or more of the following technical advantages. In some embodiments, codewords may be corrected by a single-error-correcting GRAND. For more severe channel conditions, multiple-error-correcting GRAND can be used to correct codewords. Using GRAND burst discovery can reduce and or eliminate the use of MP decoding.

BRIEF DESCRIPTION OF THE DRAWINGS

The accompanying drawings, which are included to provide a further understanding of the disclosure and are incorporated in and constitute a part of this application, illustrate certain non-limiting embodiments of inventive concepts. In the drawings:

FIG. 17 is a block diagram illustrating a communication device according to some embodiments of inventive concepts;

FIG. 18 is a block diagram illustrating a radio access network RAN node (e.g., a base station eNB/gNB) according to some embodiments of inventive concepts;

FIG. 19 is a block diagram illustrating a core network CN node (e.g., an AMF node, an SMF node, etc.) according to some embodiments of inventive concepts;

DETAILED DESCRIPTION

Figure 1:
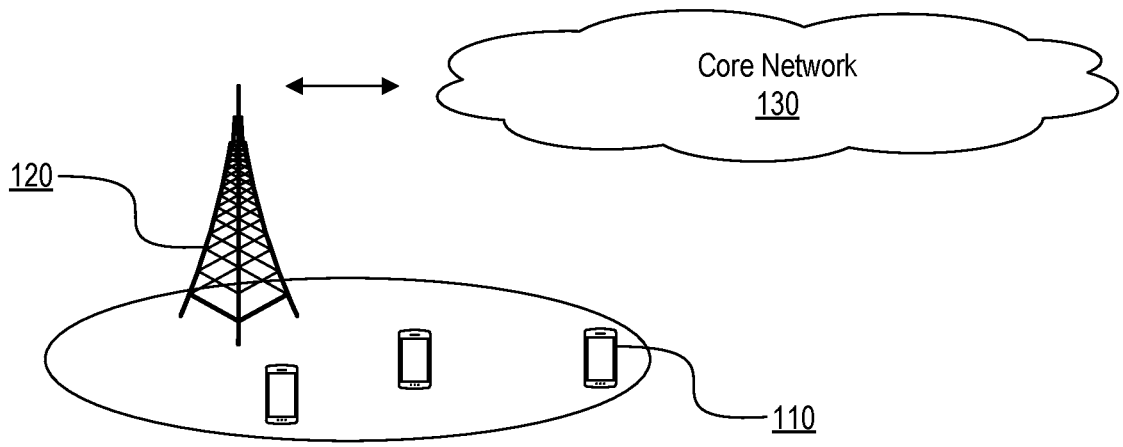
FIG. 1 is a schematic diagram illustrating an example of a 5th generation ("5G") network.

Some of the embodiments contemplated herein will now be described more fully with reference to the accompanying drawings. Embodiments are provided by way of example to convey the scope of the subject matter to those skilled in the art. Inventive concepts may, however, be embodied in many different forms and should not be construed as limited to the embodiments set forth herein. Rather, these embodiments are provided so that this disclosure will be thorough and complete, and will fully convey the scope of present inventive concepts to those skilled in the art. It should also be noted that these embodiments are not mutually exclusive. Components from one embodiment may be tacitly assumed to be present/used in another embodiment.

Forward-error correction is an essential component of any communication system. Low density parity-check ("LDPC") codes are used in many wireless standards, including 5G and Wi-Fi. Message passing ("MP"), also known as belief propagation, decoding is a contemporary procedure for decoding LDPC codes. Decoding techniques can be codeword-centric. For example, once a word is received, a decoding algorithm can attempt to find a codeword that is close to the received word following an approximate maximum likelihood criterion via message passing.

A decoding strategy, which is noise-centric, has been proposed for binary additive noise channels. Guessing random additive noise decoding ("GRAND") aims to find the noise sequence introduced by the channel instead of operating on the received word directly. There is also an extension of GRAND to real- and complex-valued channels; however, this application focuses discussion on the binary case.

GRAND can be described in three parts: a noise guesser; a buffer with candidate words; and a code membership function. A noise guesser can include a component that outputs candidate noise sequences. A buffer with candidate words can include a component that stores a multiplicity of candidate codewords. A candidate codeword is the received symbol sequence, called word, minus the noise sequence generated by the noise guesser. A code membership function can include a component that is needed to check if candidate codewords are codewords.

GRAND can also include an abandonment rule, which is based on reaching a threshold on the number of candidate noise sequences that have been tested. It can be unfeasible to check all noise sequences, since their number is exponential in the codeword length. Therefore, after guessing a predetermined number of noise sequences, the decoding can be stopped regardless of whether or not one or more codewords are found.

The complexity of GRAND can be deterministic. The performance of GRAND can approach maximum likelihood in the limit of large number of guesses, and it has been shown that the abandonment strategy, if not too restrictive, has immaterial impact on performance.

GRAND can be assumed to operate at very low channel error probability. In particular, for a binary symmetric channel, the average number of errors per word is assumed to be a small integer. In some simulation results, such a small integer is at most 1 with very high probability.

In some examples, an advantage of GRAND is that it achieves the communication performance of long codes with a shorter code. Therefore, multiple shorter codewords can be concatenated into a longer transport block (sequence of transmitted symbols).

Practical communication channels often experience fading (e.g., the instantaneous signal-to-noise ratio ("SNR") varies over time). Low instantaneous SNR results in error bursts (e.g., consecutive symbols being affected). The fading channel can be modeled either as continuous fading or block fading. In the former case, error bursts have random lengths whereas in the latter case, the burst length is given by the block fading length.

An interleaver can be used to break up the error bursts to make the errors appear random. FECs are commonly designed to correct random errors rather than burst errors, and the interleaver can make for better decoding performance.

There currently exists certain challenges. For example, for GRAND to be computationally feasible, the number of errors introduced by the channel needs to be small in absolute value, namely not only the fraction of errors per word needs to be small, but also the number of errors. With two or more errors per codeword, existing GRAND becomes computationally unfeasible.

A key component of the GRAND decoding algorithm is the noise guesser. Breaking up error bursts makes the errors appear random and, for an ideal interleaver, evenly distributed between codewords. However, deinterleaving of error bursts makes it harder for the noise guesser to provide the most probable noise sequences. Without knowledge on the bursts, the GRAND decoder would need to evaluate noise sequences that are unlikely without the possibility of estimating it, which implies higher computational complexity.

Certain aspects of the disclosure and their embodiments may provide solutions to these or other challenges. In some embodiments, the fact that the errors appear in burst and that the overall error probability is small can be taken advantage of by iteratively applying a GRAND decoder and burst error discovery. In additional or alternative embodiments, the overall complexity of the decoder can be reduced by minimizing the number of times the MP decoder is used.

The received sequence, including multiple codewords, can be deinterleaved and the codewords are checked if they are correct. Incorrect codewords are checked for single-error sequences and identified errors are then re-interleaved. The re-interleaved bits are starting points for burst extension/discovery, and the bursts are expanded by hypothesizing that neighboring bits are in error. These bits are flipped and deinterleaved and the decoder is rerun on codewords that were not correct in the previous iteration.

This process can be repeated until all codewords are corrected or a stopping criterion is met. If incorrect codewords remain, they are either decoded by a more complex MP decoder or a repeat transmission request is triggered.

Certain embodiments may provide one or more of the following technical advantages. With a proper interleaving design, most codewords can be corrected by a single-error-correcting GRAND. For more severe channel conditions, multiple-error GRAND may be used on the remaining codewords in error if it is advantageous to avoid switching to MP decoding immediately. Overall, the proposed algorithms can reduce or even eliminate the use of MP decoding.

Further complexity savings can be attained by using a less complex GRAND than standard GRAND. In particular, single-error correction in most cases can become trivial (e.g., only a single syndrome computation needed).

Burst extension can be tailored to system and channel properties (e.g., resource block boundaries, expected length of bursts for Gilbert-Elliott models).

FIG. 17 is a block diagram illustrating elements of a communication device UE 1700 (also referred to as a mobile terminal, a mobile communication terminal, a wireless device, a wireless communication device, a wireless terminal, mobile device, a wireless communication terminal, user equipment, UE, a user equipment node/terminal/device, etc.) configured to provide wireless communication according to embodiments of inventive concepts. (Communication device 1700 may be provided, for example, as discussed below with respect to wireless devices UE 2212A, UE 2212B, and wired or wireless devices UE 2212C, UE 2212D of FIG. 22, UE 2300 of FIG. 23, virtualization hardware 2604 and virtual machines 2608A, 2608B of FIG. 26, and UE 2706 of FIG. 27, all of which should be considered interchangeable in the examples and embodiments described herein and be within the intended scope of this disclosure, unless otherwise noted.) As shown, communication device UE may include an antenna 1707 (e.g., corresponding to antenna 2322 of FIG. 23), and transceiver circuitry 301 (also referred to as a transceiver, e.g., corresponding to interface 2312 of FIG. 23 having transmitter 2318 and receiver 2320) including a transmitter and a receiver configured to provide uplink and downlink radio communications with a base station(s) (e.g., corresponding to network node 2210A, 2210B of FIG. 22, network node 2400 of FIG. 24, and network node 2704 of FIG. 27 also referred to as a RAN node) of a radio access network. Communication device UE may also include processing circuitry 1703 (also referred to as a processor, e.g., corresponding to processing circuitry 2302 of FIG. 23, and control system 2612 of FIG. 26) coupled to the transceiver circuitry, and memory circuitry 1705 (also referred to as memory, e.g., corresponding to memory 2310 of FIG. 22) coupled to the processing circuitry. The memory circuitry 1705 may include computer readable program code that when executed by the processing circuitry 1703 causes the processing circuitry to perform operations according to embodiments disclosed herein. According to other embodiments, processing circuitry 1703 may be defined to include memory so that separate memory circuitry is not required. Communication device UE may also include an interface (such as a user interface) coupled with processing circuitry 1703, and/or communication device UE may be incorporated in a vehicle.

As discussed herein, operations of communication device UE may be performed by processing circuitry 1703 and/or transceiver circuitry 1701. For example, processing circuitry 1703 may control transceiver circuitry 1701 to transmit communications through transceiver circuitry 1701 over a radio interface to a radio access network node (also referred to as a base station) and/or to receive communications through transceiver circuitry 1701 from a RAN node over a radio interface. Moreover, modules may be stored in memory circuitry 1705, and these modules may provide instructions so that when instructions of a module are executed by processing circuitry 1703, processing circuitry 1703 performs respective operations (e.g., operations discussed below with respect to Example Embodiments relating to wireless communication devices). According to some embodiments, a communication device UE 1700 and/or an element(s)/function(s) thereof may be embodied as a virtual node/nodes and/or a virtual machine/machines.

FIG. 18 is a block diagram illustrating elements of a radio access network RAN node 1800 (also referred to as a network node, base station, eNodeB/eNB, gNodeB/gNB, etc.) of a Radio Access Network (RAN) configured to provide cellular communication according to embodiments of inventive concepts. (RAN node 1800 may be provided, for example, as discussed below with respect to network node 2210A, 2210B of FIG. 22, network node 2400 of FIG. 3, hardware 2604 or virtual machine 2608A, 2608B of FIG. 26, and/or base station 2704 of FIG. 27, all of which should be considered interchangeable in the examples and embodiments described herein and be within the intended scope of this disclosure, unless otherwise noted.) As shown, the RAN node may include transceiver circuitry 1801 (also referred to as a transceiver, e.g., corresponding to portions of RF transceiver circuitry 2412 and radio front end circuitry 2418 of FIG. 24) including a transmitter and a receiver configured to provide uplink and downlink radio communications with mobile terminals. The RAN node may include network interface circuitry 1807 (also referred to as a network interface, e.g., corresponding to portions of communication interface 2406 of FIG. 24) configured to provide communications with other nodes (e.g., with other base stations) of the RAN and/or core network CN. The network node may also include processing circuitry 1803 (also referred to as a processor, e.g., corresponding to processing circuitry 2402 of FIG. 24) coupled to the transceiver circuitry, and memory circuitry 1805 (also referred to as memory, e.g., corresponding to memory 2404 of FIG. 24) coupled to the processing circuitry. The memory circuitry 1805 may include computer readable program code that when executed by the processing circuitry 1803 causes the processing circuitry to perform operations according to embodiments disclosed herein. According to other embodiments, processing circuitry 1803 may be defined to include memory so that a separate memory circuitry is not required.

As discussed herein, operations of the RAN node may be performed by processing circuitry 1803, network interface 1807, and/or transceiver 1801. For example, processing circuitry 1803 may control transceiver 1801 to transmit downlink communications through transceiver 1801 over a radio interface to one or more mobile terminals UEs and/or to receive uplink communications through transceiver 1801 from one or more mobile terminals UEs over a radio interface. Similarly, processing circuitry 1803 may control network interface 1807 to transmit communications through network interface 1807 to one or more other network nodes and/or to receive communications through network interface from one or more other network nodes. Moreover, modules may be stored in memory 1805, and these modules may provide instructions so that when instructions of a module are executed by processing circuitry 1803, processing circuitry 1803 performs respective operations (e.g., operations discussed below with respect to Example Embodiments relating to RAN nodes). According to some embodiments, RAN node 1800 and/or an element(s)/function(s) thereof may be embodied as a virtual node/nodes and/or a virtual machine/machines.

According to some other embodiments, a network node may be implemented as a core network CN node without a transceiver. In such embodiments, transmission to a wireless communication device UE may be initiated by the network node so that transmission to the wireless communication device UE is provided through a network node including a transceiver (e.g., through a base station or RAN node). According to embodiments where the network node is a RAN node including a transceiver, initiating transmission may include transmitting through the transceiver.

FIG. 19 is a block diagram illustrating elements of a core network (CN) node (e.g., an SMF (session management function) node, an AMF (access and mobility management function) node, etc.) of a communication network configured to provide cellular communication according to embodiments of inventive concepts. (CN node 1900 may be provided, for example, as discussed below with respect to core network node 2208 of FIG. 22, hardware 2604 or virtual machine 2608A, 2608B of FIG. 26, all of which should be considered interchangeable in the examples and embodiments described herein and be within the intended scope of this disclosure, unless otherwise noted) As shown, the CN node may include network interface circuitry 1907 configured to provide communications with other nodes of the core network and/or the radio access network RAN. The CN node may also include a processing circuitry 1903 (also referred to as a processor,) coupled to the network interface circuitry, and memory circuitry 1905 (also referred to as memory) coupled to the processing circuitry. The memory circuitry 1905 may include computer readable program code that when executed by the processing circuitry 1903 causes the processing circuitry to perform operations according to embodiments disclosed herein. According to other embodiments, processing circuitry 1903 may be defined to include memory so that a separate memory circuitry is not required.

As discussed herein, operations of the CN node may be performed by processing circuitry 1903 and/or network interface circuitry 1907. For example, processing circuitry 1903 may control network interface circuitry 1907 to transmit communications through network interface circuitry 1907 to one or more other network nodes and/or to receive communications through network interface circuitry from one or more other network nodes. Moreover, modules may be stored in memory 1905, and these modules may provide instructions so that when instructions of a module are executed by processing circuitry 1903, processing circuitry 1903 performs respective operations (e.g., operations discussed below with respect to Example Embodiments relating to core network nodes). According to some embodiments, CN node 1900 and/or an element(s)/function(s) thereof may be embodied as a virtual node/nodes and/or a virtual machine/machines.

Figure 2:
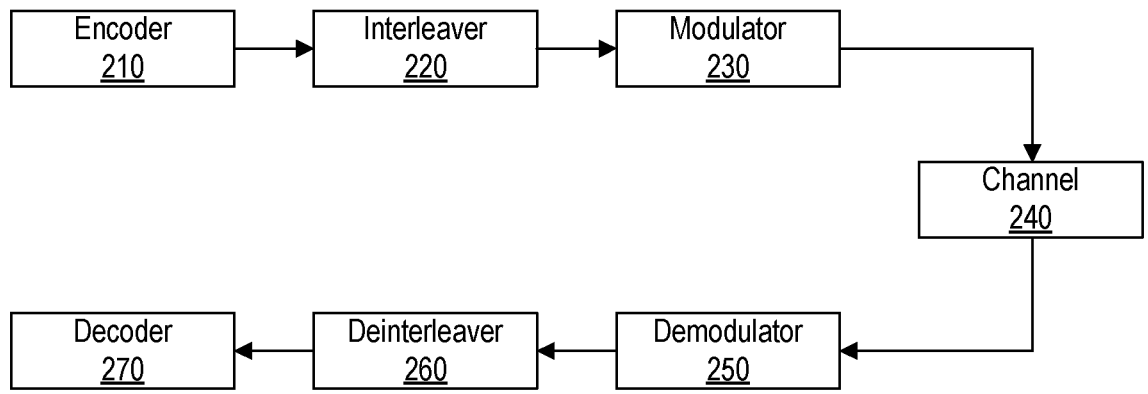
FIG. 2 is a block diagram illustrating an example of modules/functions of a 5G network according to some embodiments of inventive concepts.

A system model, as illustrated in FIG. 2, is described below. The system model can include a transmitter (that includes an encoder 210, interleaver 220, and a modulator 230) communicatively coupled to a receiver (decoder 270, deinterleaver 260, and a demodulator 250) by a channel 240. A channel encoder 210 can encode a bit stream. An interleaver 220 can be communicatively coupled to the channel encoder 210 and interleave the encoded bit stream to generate coded symbols. A modulator 230 can be communicatively coupled to the interleaver 220 and modulate the coded symbols. A signal (also referred to herein as a waveform) including the coded symbols can be corrupted by the channel 240. The demodulator 250 can demodulate the signal received via the channel to generate coded symbols. The deinterleaver 260 can be communicatively coupled to the demodulator 250 and deinterleave the coded symbols and each word can be decoded on its own by the decoder 270. In some embodiments, an architecture can be provided in which with the receiver operations are performed iteratively, where at each stage the decoder gets stronger in its ability to correct errors. The proposed architecture can apply deinterleaving and decoding back and forth a number of times depending on the available computational capability of the system or on satisfying a stop criterion.

Figure 3:
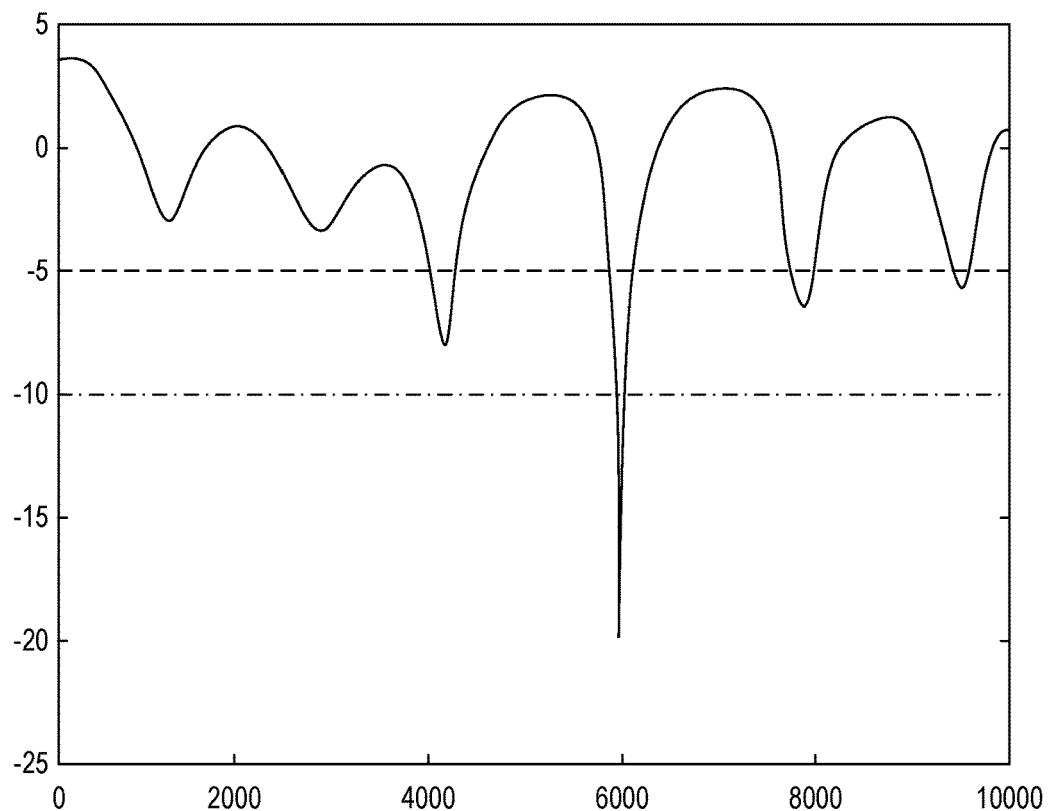
FIG. 3 is a graph illustrating an example of a continuously varying fading channel according to some embodiments of inventive concepts.
Figure 4:
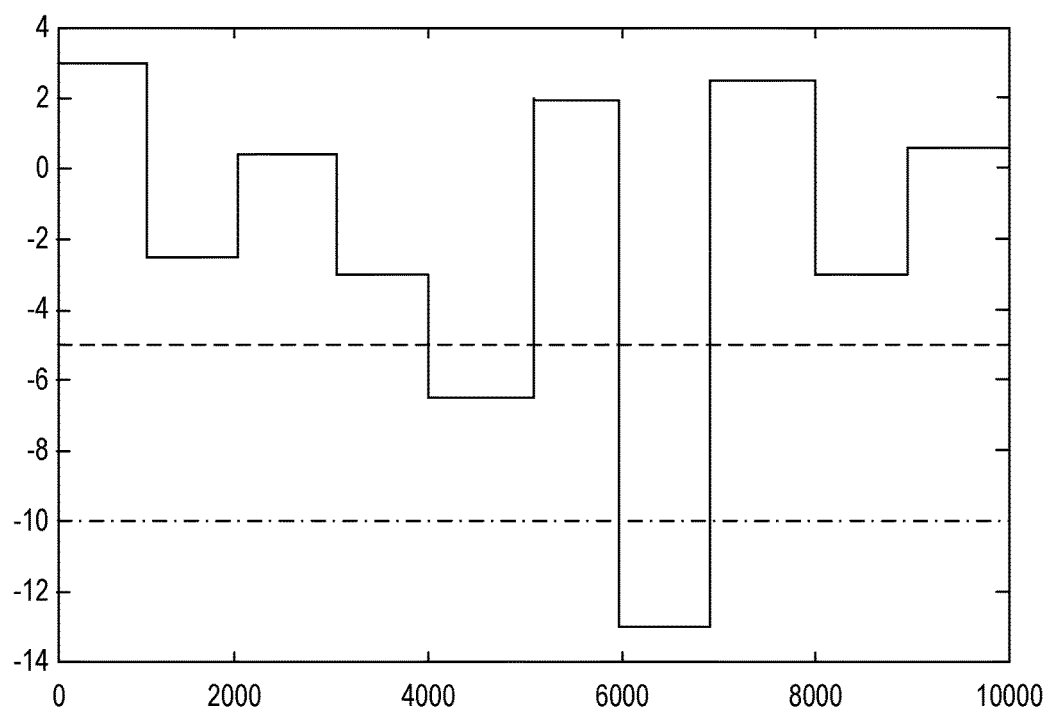
FIG. 4 is a graph illustrating an example of a block-fading channel according to some embodiments of inventive concepts.

Channel models are described below. In some examples, interleaving and deinterleaving can be effective in the presence of a bursty channel. In practice, this often happens with a fading channel, where fast fading cannot be counteracted. FIGS. 3-4 illustrate examples of the evolution of the amplitude of a fading channel in time or frequency. The amplitude of the channel appears random and is distributed according to a distribution that is characteristic of the fading (e.g., for Rayleigh fading, the amplitude is Rayleigh). The average of the amplitude square is one by definition of fast fading (a constant loss is included in the pathloss). This means that randomly there are fading dips, i.e., the channel coefficient is much lower than 1, which in dB looks like a dip, whence the name (see FIG. 3 not sampled; FIG. 4: sampled; in some cases, it makes sense to use the underlying properties of the block-fading model of FIG. 4 to enhance the burst discovery as described later). There may also be other reasons for bursts that are not discussed herein (e.g., interference).

In some examples, it can be assumed that the received bitstream is affected by bursty noise alongside thermal noise. The fading can cause the bursty behavior (e.g., when the signal strength is low (in the fading dips) the noise impact is greater). The difference between the two can be that the probability of a bit being in error when in a burst is much larger than that of a bit only affected by thermal noise. In an extreme case, all bits in a burst are in error and all bits not in a burst are error-free.

For binary channels, the received valued are 0s or 1s. However, also continuous channel may be supported. For continuous channels, a log likelihood ratio ("LLR") is computed for use in a soft decoder. In some embodiments described below, a binary channel is assumed, however, the description also applies to continuous channels. Herein the phrase flipping bits, or similar, can refer to changing a 0 to a 1 and vice versa in a binary channel, and for a continuous channel that would correspond to a change of the sign of the LLR. In particular, the burst extension with appropriate modifications will work also for continuous channels.

Figure 5:
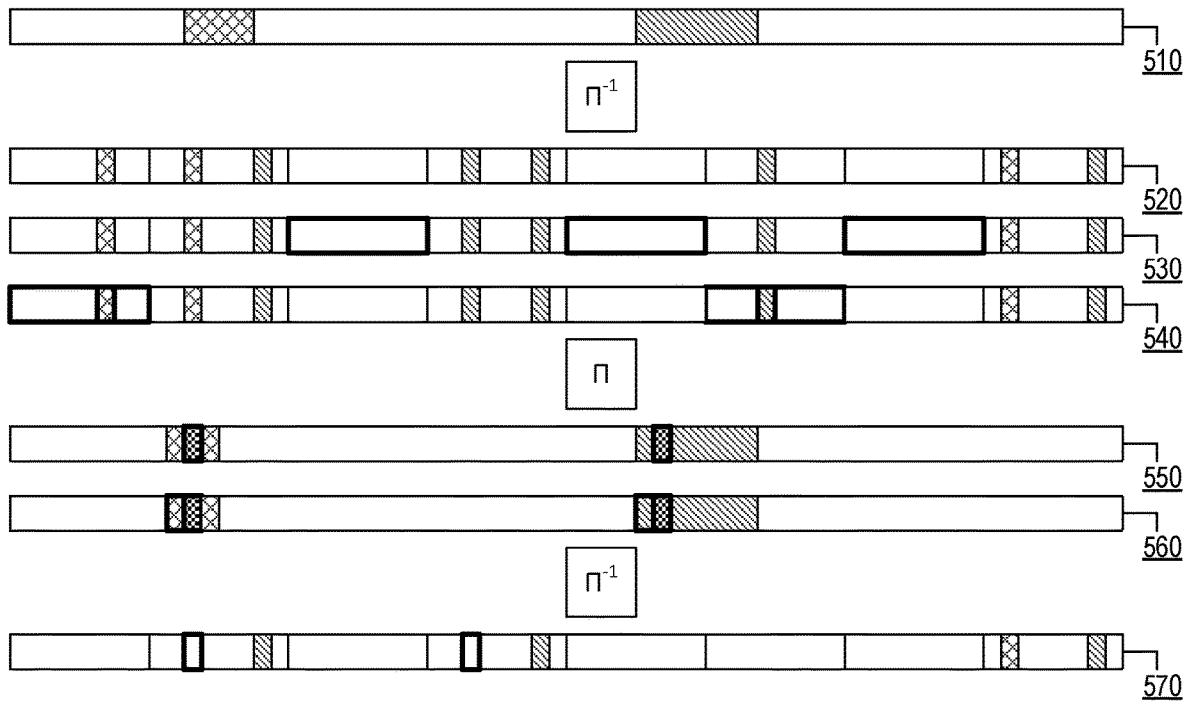
FIG. 5 is a schematic diagram illustrating an example of iterative decoding and burst extension for a continuously fading channel according to some embodiments of inventive concepts.

An example of operations for performing an iterative GRAND burst discovery is described in FIG. 5. The received frame is affected by error bursts (510). After deinterleaving (520), syndrome computations for all codewords are performed. Some codewords are identified as correct (530) since it can be assumed that errors never result in forming another codeword. Single-error guessing is performed on all codewords in error. Some of these codewords, those affected by one error, are corrected (540). As a by-product, the bits that were in error can be determined, which point to error bursts in the frame.

By re-interleaving the frame, the bits in error are placed in some position of the frame. These bits are, by model assumption, in a burst (550). The bits can be marked around those bits in error as potentially in a burst. The precise logic is determined by a burst-extension procedure. There are many, general as well as model-specific, burst-extension mechanisms that one could come up with. In some examples, the bits that are identified by some burst-extension procedure can be referred to as the "error-candidate bits." The identity of the error bits may be unknown, but these bits are candidate bits in error.

The frame can be deinterleaved by keeping track of the error-candidate bits (560). The error-candidate bits can be flipped and single-error guesses performed on the codeword. If the error-candidate bit is in error and the codeword is affected by two errors only, then it is possible to discover the second error with computational complexity that is linear instead of quadratic in the codeword length. Some codewords will be corrected, while others will not either because there are more than two errors or because the burst-extension procedure suggested an error-candidate bit that was not in error.

At this point the decoding procedure can either be stopped or continue by going back to operation 530 and performing operations 540 and 550 with the two-error guesses instead of single-error guesses; and when operation 560 is reached again, then the procedure can return to 530 and continue performing the three-error guesses instead of the two-error guesses; and so on until a computational complexity limit is reached or some stopping criterion is satisfied.

In some embodiments, if two-error guess is desired in operation 560, all remaining codewords in error that are affected by two errors will be corrected. Other bits in error can be identified. The frame can be interleaved by keeping track of the positions where the just-corrected bits land, which can enable identifying more error-candidate bits.

Figure 6:
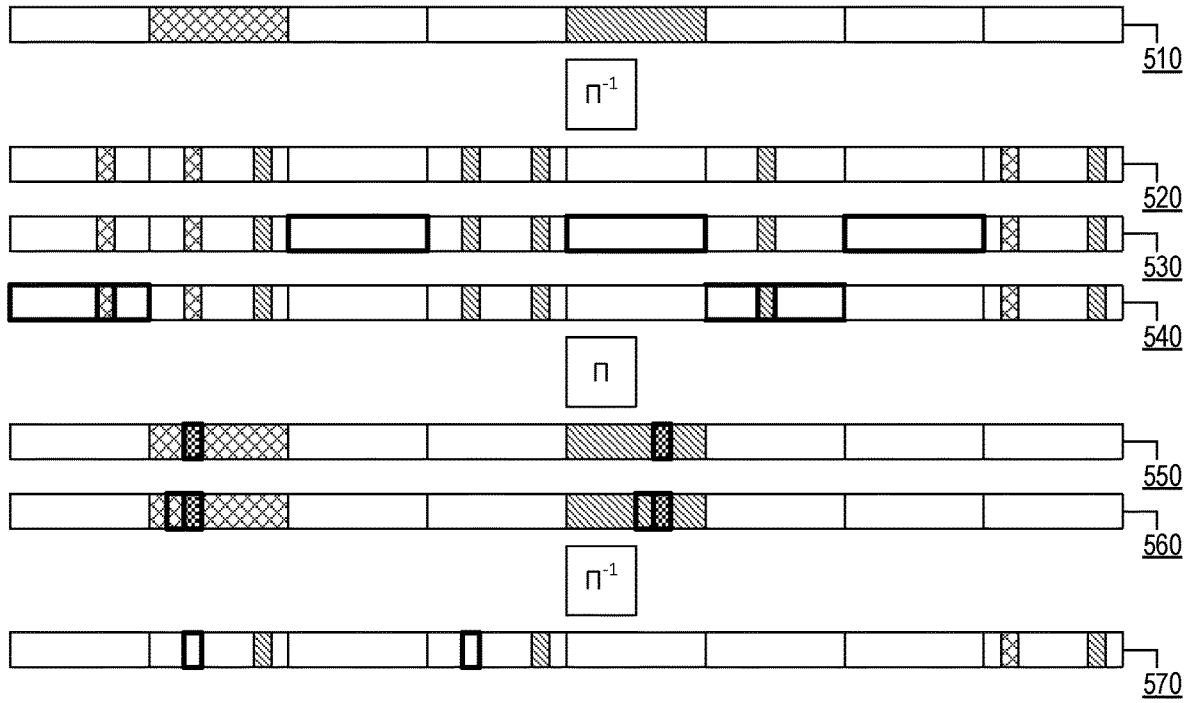
FIG. 6 is a schematic diagram illustrating an example of iterative decoding and burst extension for a block-fading channel according to some embodiments of inventive concepts.

Up to this point, no assumptions were made regarding the length of the codewords and the position of the error bursts. In particular, the frame could be composed of codewords of different length and error bursts could start anywhere along the frame. However, due to the physics of propagation and modulation and coding scheme ("MCS") selection, it is possible to map specific points where error bursts are likely to start, in which case entire blocks of bits, whose length depend on the channel property and MCS selected, will likely be in error (see FIG. 6). In these cases, the burst-extension procedure would benefit from such a knowledge.

Figure 7:
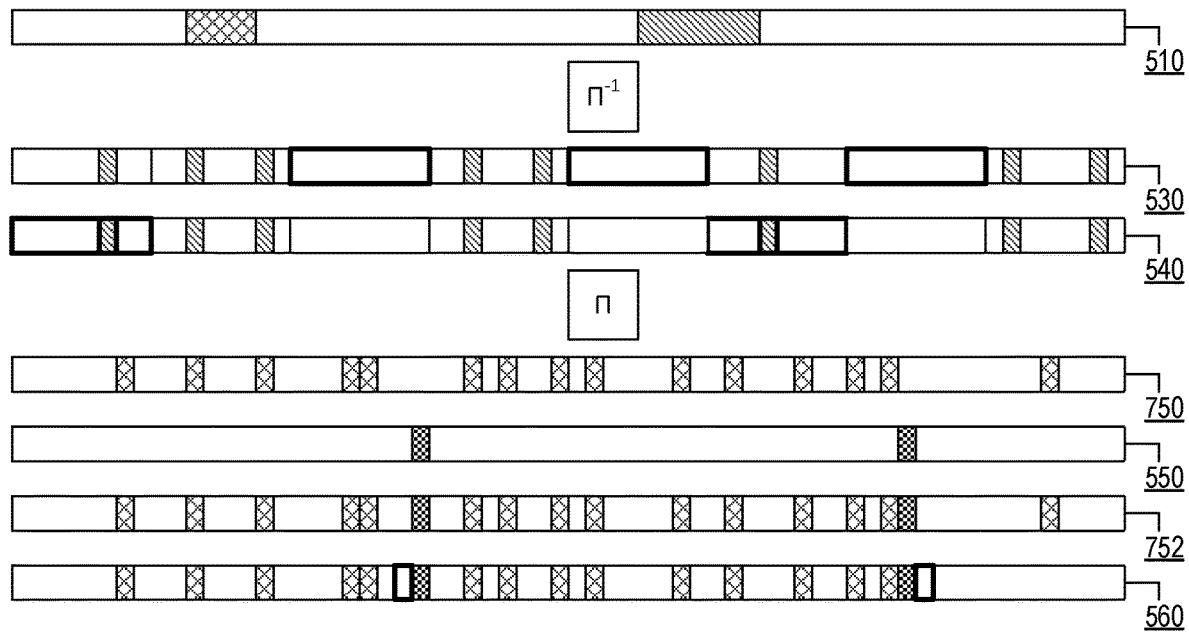
FIG. 7 is a schematic diagram illustrating an example of iterative decoding and burst extension for a continuously fading channel based on some bits being known correct and some bits being known errors according to some embodiments of inventive concepts.

While the description above only explicitly describes using a position of bits in error to identify other bits that may be in error, knowledge that some bits are correct can be used to stop extending a burst in that direction. An improvement to some of the above embodiments can rely, therefore, on the knowledge that some bits are correct. For example, in FIG. 7, operation 750 bits that are known to be correct are identified and in operation 752 knowledge of correct bits and error bits are used to mark bits for burst extension.

Figure 8:
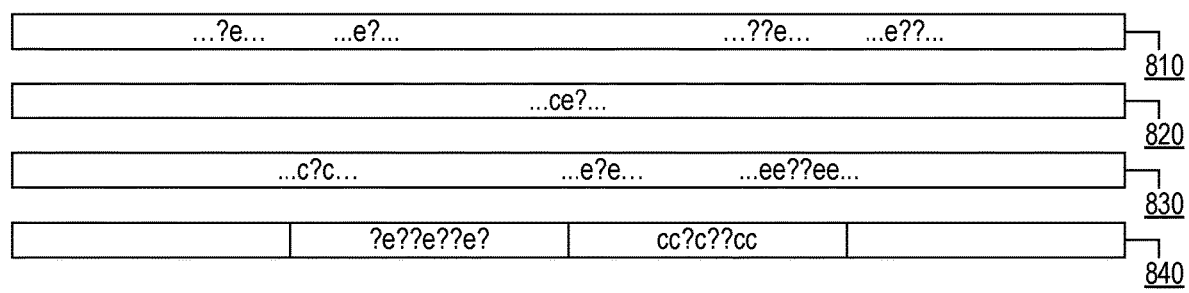
FIG. 8 is a schematic diagram illustrating an example of a burst extension operation based on some bits being known correct and some bits being known errors according to some embodiments of inventive concepts.

Examples of burst extensions are described below in regards to FIG. 8. Transition logic 810 includes extending a burst by flagging unknown bits that are next to known bits in error as potentially in error. Extension limit logic 820 includes not extending a burst behind correct bits. Majority logic 830 includes scanning a bitstream by applying a window of length w. Then applying a majority rule to flag all unknown bits on the basis of the known bits in the window. If there are more correct known bits than known bits in error, then flag all unknown bits, if any, as correct, and vice versa. Another variation is to guarantee that unknown bits are not at the edge of the window, and if they are, go to the next window. Iterative scans are also possible. Whole block-burst logic 840 includes knowing that error bursts affect blocks of bits, rather than single bits independently, suggests flagging all unknown bits in a block as the known bits in the block. If there are inconsistencies, a majority logic or other logics to resolve it can be used.

The computational complexity of proposed embodiments is described below relative to classic approaches. To compare the approach proposed in some embodiments herein with an alternative classic approach of coding on one long block, the computational complexity of both approaches can be considered and their complexity compared to achieve zero errors whenever possible.

In some embodiments, the processes of interleaving and deinterleaving do not require computations. They can be accomplished by reading memory entries in some predetermined order.

Bit flipping may require computations. They may be accounted for by considering a bit flipping as one sum modulo 2. However, they may not be accounted for since their contribution to the computational complexity is marginal. To see this, just consider that every time one or two bits are flipped, a syndrome is also computed, which is orders of magnitude more computationally demanding. In fact, one- or two-bit flips account for one or two sums modulo 2, respectively, but the complexity of a syndrome computation scales with n. The details are discussed below.

All remaining computations are syndrome checks. Each syndrome check requires on average $md_c$ sums, where $m=n(1-R)$ is the number of rows in the parity-check matrix of the block, n is the block length, R is the rate, and dc is the average check-node degree. Each bit flipping adds one sum to the overall number of sums.

For example, in operations 520 above, syndrome computations for all codewords are performed. Since there is no bit flipping and there are I codewords of length n, the computational complexity is at most I $\Sigma(n)$ where $\Sigma(n)$ is the computational complexity (=number of sums) required to check the syndrome of a codeword of length n. In operations 530, 540, 550, and 560, every time there is a bit flipping, one can be added to the current value of the computational complexity, and every time there's a syndrome computation, $\Sigma(n)$ is added on average (in the actual simulations, all sums that occur in the message passing decoder for the chosen parity-check matrices can be counted as well as the number of sums required for a syndrome computation).

After a predetermined number of operations, either all codewords are correct or there is still some error. In those words that are still in error, a traditional decoder can be run (e.g., a message-passing decoder if the blocks are LDPC coded).

A syndrome computation can be equivalent to a half-iteration of a message passing decoder. Thus, the computational complexity can be tracked inside the decoder by evaluating the number of iterations required to remove all errors, if possible. For example, if the number of iterations performed before stopping is i, then the LDPC decoding component of the computational complexity is 2i Σ(n).

In some alternative approaches, the length-ln block can be decoded without using the interleaver. Since a syndrome computation is equivalent to half-iteration of a message passing decoder, then the computational complexity per iteration is given by 2i Σ(ln). This underestimates the actual computational complexity because the computations inside the decoder could be more demanding than just bit-flipping or sum modulo 2.

To compare the proposed approach of interleaving and deinterleaving short blocks with the alternative approach of directly coding over a longer block, codes of length n and ln can be chosen. The comparison will be made under the same rate constraint.

Limitations of the comparison are described below. The scope of the comparison is limited because it doesn't account for the following. The proposed approach and traditional decoding can be used together—they are not mutually exclusive—and in scenarios with high enough signal-to-noise ratio the proposed approach can be used on its own. In some embodiments, the proposed approach doesn't need an actual decoder but only simple hardware (e.g., bit flipping and syndrome check); typically, a decoder is much more complex. As such, there may be energy efficiency gain to use the proposed approach that are difficult to quantify, but simple to envision.

In additional or alternative embodiments, the proposed approach corrects words affected by single and double errors irrespective of the rate of the underlying code and irrespective of the word length.

In additional or alternative embodiments, coding on a long block means that either the block is decoded correctly, in which case all bits are recovered, or it is not possible to decode it correctly, in which case all bits are lost. There is no "in between." This is also true for each short block in the proposed approach, but coding on many short blocks means that some of the blocks may still reach the destination. The price to pay is in the form of coding gain; nonetheless, in some scenario, e.g., mission critical and delay-sensitive applications, it may be preferred that some information reaches the destination often rather than a lot of information either reaches the destination or not. (This can also be accomplished with a long block and lower coding rate, but it would require higher latency.) In more analytical terms, the distribution of successful decoding events is different, and which one is to prefer depends on the application.

In some examples, short codes are preferred anyway, and the signal-to-noise ratio is kept large enough by the protocol (e.g., MCS selection). In those examples, the proposed approach can "clean out" some of the words without the need of calling a traditional decoder.

In the description that follows, while the network node may be any of the communication device 1700, wireless device 2212A, 2212B, wired or wireless devices UE 2212C, UE 2212D, UE 2300, virtualization hardware 2604, virtual machines 2608A, 2608B, UE 2706, RAN node 1800, network node 2210A, 2210B, 2400, 2706, hardware 2604, or virtual machine 2608A, 2608B, the RAN node 1800 shall be used to describe the functionality of the operations of the network node. Operations of the RAN node 1800 (implemented using the structure of FIG. 18) will now be discussed with reference to the flow charts of FIGS. 20-21 according to some embodiments of inventive concepts. For example, modules may be stored in memory 1805 of FIG. 18, and these modules may provide instructions so that when the instructions of a module are executed by respective RAN node processing circuitry 1803, processing circuitry 1803 performs respective operations of the flow charts.

Figure 20:
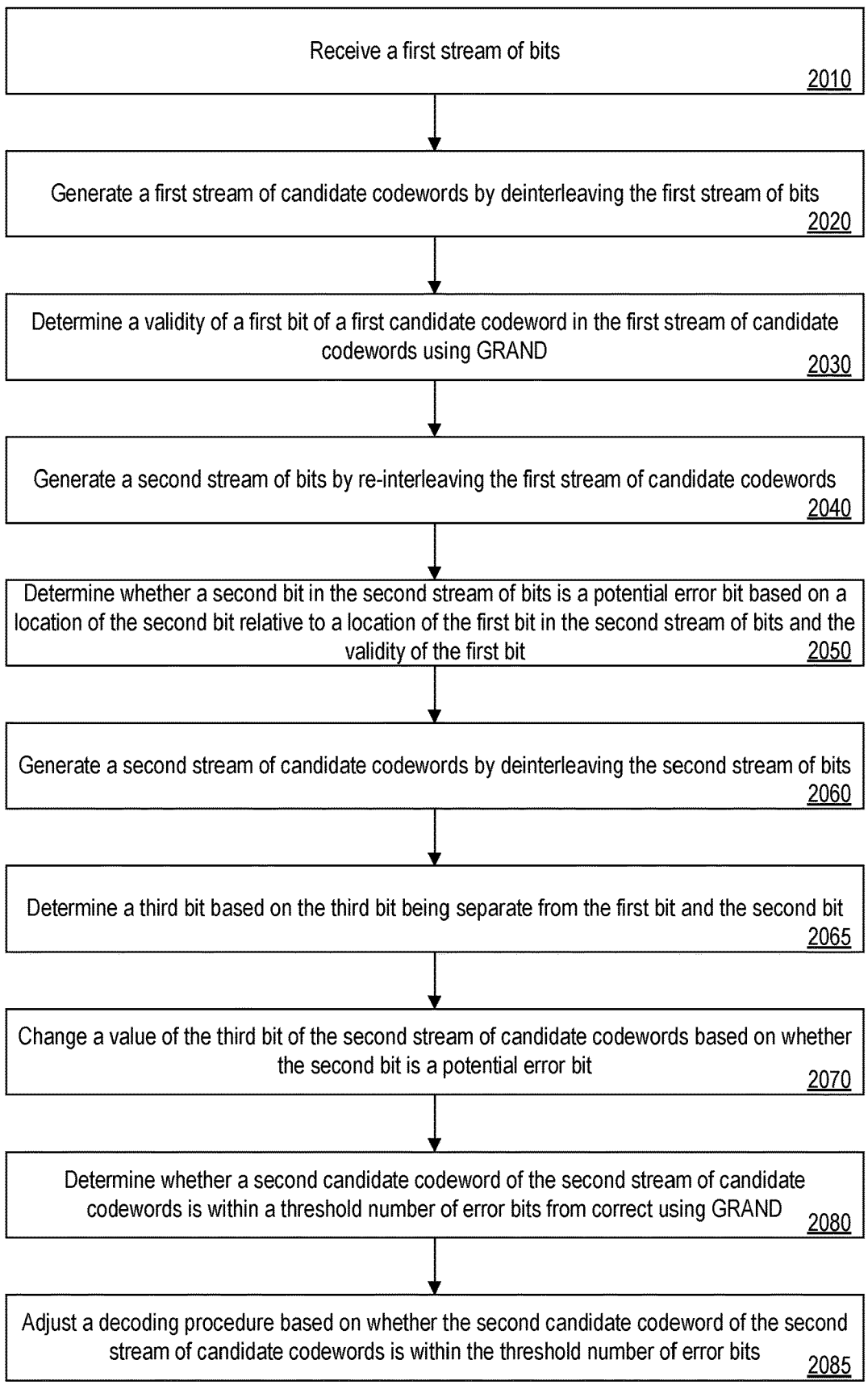
FIG. 20 is a flow chart illustrating an example of operations of a network node according to some embodiments of inventive concepts.

FIG. 20 illustrates an example of operations performed by a first network node in a wireless communications network. In some embodiments, the wireless communications network is a 5th generation, 5G network, and the first network node includes at least one of a radio access network, RAN, node and a communication device.

At block 2010, processing circuitry 1803 receives, via transceiver 1801, a first stream of bits.

At block 2020, processing circuitry 1803 generates a first stream of candidate codewords by deinterleaving the first stream of bits.

At block 2030, processing circuitry 1803 determines a validity of a first bit of a first candidate codeword in the first stream of candidate codewords using GRAND. In some embodiments, determining the validity of the first bit includes determining that the first bit is an error bit and that the first candidate codeword has a single error bit.

In additional or alternative embodiments, determining the validity of the first bit includes determining which candidate codewords in the first stream of candidate codewords are correct using syndrome computations; determining which candidate codewords in the first stream of candidate codewords have a single error bit using a single-error-correcting version of GRAND; and determining each of the single error bits including the first bit.

In additional or alternative embodiments, determining the validity of the first bit includes determining that the first bit is a correct bit and that the first candidate codeword is correct.

At block 2040, processing circuitry 1803 generates a second stream of bits by re-interleaving the first stream of candidate codewords.

At block 2050, processing circuitry 1803 determines whether a second bit in the second stream of bits is a potential error bit based on a location of the second bit relative to a location of the first bit in the second stream of bits and the validity of the first bit.

In some embodiments, determining whether the second bit is a potential error bit includes determining that the second bit is a potential error bit based on at least one of: the second bit being within a threshold number of bit positions from the first bit; the second bit being between the first bit and another error bit; and the first stream being received via a block-fading channel and the second bit being part of the same block as the first bit.

In additional or alternative embodiments, when the first bit is a correct bit, determining whether the second bit is a potential error bit includes determining that the second bit is not a potential error bit based on at least one of: the second bit being within a threshold number of bit positions from the first bit; the second bit being between the first bit and another correct bit; and the first stream being received via a block-fading channel and the second bit being part of the same block as the first bit, At block 2060, processing circuitry 1803 generates a second stream of candidate codewords by deinterleaving the second stream of bits.

At block 2065, processing circuitry 1803 can determine a third bit based on the third bit being separate from the first bit and the second bit. In other embodiments, the third bit can be the second bit.

At block 2070, processing circuitry 1803 changes a value of the third bit of the second stream of candidate codewords based on whether the second bit is a potential error bit.

In some embodiments, determining the validity of the first bit includes determining a validity of a plurality of known bits in the first stream of candidate codewords. Determining whether the second bit is a potential error bit can include determining whether a plurality of unknown bits in the second stream of bits are potential error bits based on a location of each unknown bit of the plurality of unknown bits in the second stream relative to a location of each known bit of the plurality of known bits in the second stream of bits and the validity of the plurality of known bits. Changing the value of the third bit can include changing a value of a portion of the plurality of unknown bits based on whether the unknown are potential error bits.

At block 2080, processing circuitry 1803 determines whether a second candidate codeword of the second stream of candidate codewords is within a threshold number of error bits from correct using GRAND.

In some embodiments, determining whether the second candidate codeword of the second stream of candidate codewords is within the threshold number of error bits includes determining that the second candidate codeword of the second stream of candidate codewords is within the threshold number of error bits from correct.

At block 2085, processing circuitry 1803 adjusts a decoding procedure based on whether the second candidate codeword of the second stream of candidate codewords is within the threshold number of error bits.

In some embodiments, determining whether the second codeword of the second stream of candidate codewords is within the threshold number of error bits includes determining that the second candidate codeword of the second stream of candidate codewords exceeds the threshold number of error bits from correct. In additional or alternative embodiments, adjusting the decoding procedure includes, responsive to determining that the second candidate codeword of the second stream of candidate codewords exceeds the threshold number of error bits from correct, requesting at least a portion of first stream of bits that includes errors be resent. In additional or alternative embodiments, adjusting the decoding procedure includes, responsive to determining that the second candidate codeword of the second stream of candidate codewords exceeds the threshold number of error bits from correct, determining to switch from using GRAND to using another decoding process.

In additional or alternative embodiments, determining the validity of the first bit includes determining the validity of the first bit using a single-error guessing version of GRAND and the threshold number of error bits includes a single error bit.

Figure 21:
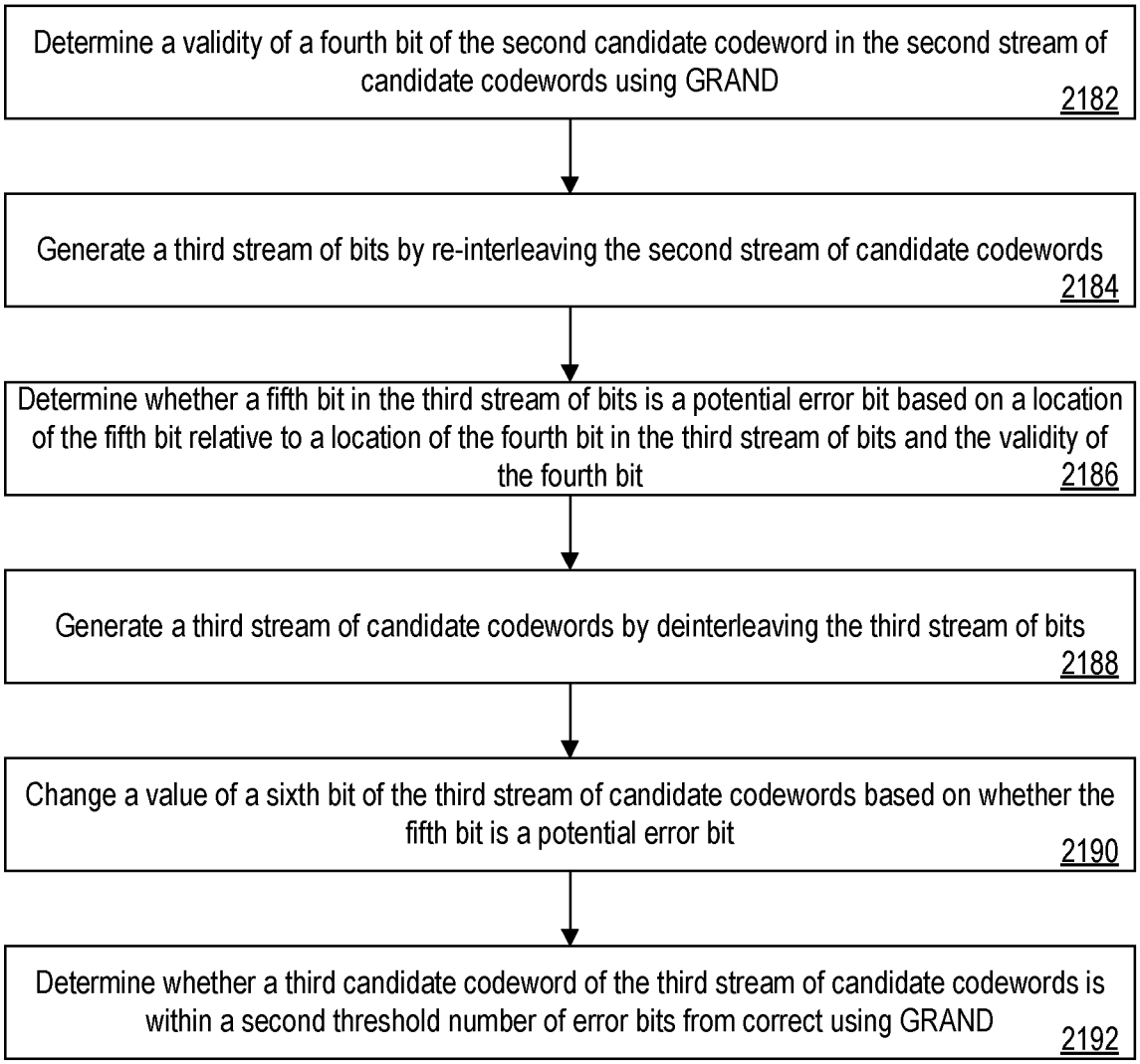
FIG. 21 is a flow chart illustrating an example of operations of a network node according to some embodiments of inventive concepts.

FIG. 21 illustrates an example of an additional iteration of the GRAND burst discovery. At block 2182, processing circuitry 1803 determines a validity of a fourth bit of the second candidate codeword in the second stream of candidate codewords using GRAND. At block 2184, processing circuitry 1803 generates a third stream of bits by re-interleaving the second stream of candidate codewords. At block 2186, processing circuitry 1803 determines whether a fifth bit in the third stream of bits is a potential error bit based on a location of the fifth bit relative to a location of the fourth bit in the third stream of bits and the validity of the fourth bit. At block 2188, processing circuitry 1803 generates a third stream of candidate codewords by deinterleaving the third stream of bits. At block 2190, processing circuitry 1803 changes a value of a sixth bit of the third stream of candidate codewords based on whether the fifth bit is a potential error bit. At block 2192, processing circuitry 1803 determines whether a third candidate codeword of the third stream of candidate codewords is within a second threshold number of error bits from correct using GRAND.

In some embodiments, determining the validity of the first bit includes determining the validity of the first bit using a single-error guessing version of GRAND and determining the validity of the fourth bit includes determining the validity of the fourth bit using a double-error version of GRAND.

Various operations from the flow chart of FIGS. 20-21 may be optional with respect to some embodiments of RAN nodes and related methods. For example, operations of blocks 2065 and 2085 of FIG. 20 and blocks 2182, 2184, 2186, 2188, 2190, and 2192 of FIG. 21 may be optional.

Interleaver design and impact on performance are described below. In some embodiments, the proposed operations work for any interleaver. However, the choice of interleaver affects the behavior of the system. Random interleavers breaks up the error burst in random ways and the number of errors in different codewords are random.

Interleavers can also be structured, e.g., Linear Congruential interleavers or Quadratic Permutation Polynomial ("QPP") interleavers. The advantage of structured interleavers is that they can be represented/stored in a compact form and their spreading properties are easier to analyze.

A linear congruential interleavers is described by y=mod (f*x,L) where y is the output index, x is the input index, f is a factor, L is the length of the interleaver, and f and L should be relatively prime. This interleaver indeed spreads linearly (with wrap around) so as long as f>=n, the errors of a burst are distributed over separate codewords.

QPP interleavers assigns an output index y as a function of the input index x: y=(f1*x+f2*x^2) mod L where f1 and f2 are factors and L is the length of the interleaver.

QPP interleavers also breaks up the error bursts in a structured way and by proper selection of f1 and f2 in relationship to n an error burst can be broken up and spread over separate codewords.

Errors from separate error bursts can be mapped to the same codeword.

Design of interleavers for different applications, e.g., turbo codes, is a rich field of research and will not be elaborated in this IvD. The purpose is rather to indicate that the choice of interleaver affects the overall performance.

Performance evaluation for one embodiment is provided below. Performance in terms of number of codewords in error at several stages of the iterative deinterleaving-GRAND process is shown. The operations are as follows: syndrome decoding, single-error guess (1-GRAND), burst extension with single-error guess; two-error guess (2-GRAND), and majority-based burst extension is applied. In syndrome decoding, the codewords in error are those that are affected by any error. In 1-GRAND, the codewords in error are those that are affected by more than one error; all single-error codewords are corrected. In burst extension with single-error guess, according to the simplest criterion of burst extension, which extends the burst (iteratively until no more errors are corrected by 1-GRAND) in both directions, the codewords in error are those affected by two or more errors that are not discovered by the burst extension. All codewords affected by 2 errors, one of which belongs to a burst identified in Stage 1, are corrected. In 2-GRAND, decoding of all remaining codewords in error is attempted via 2-GRAND. The codewords in error are those affected by three or more errors.

Figure 9:
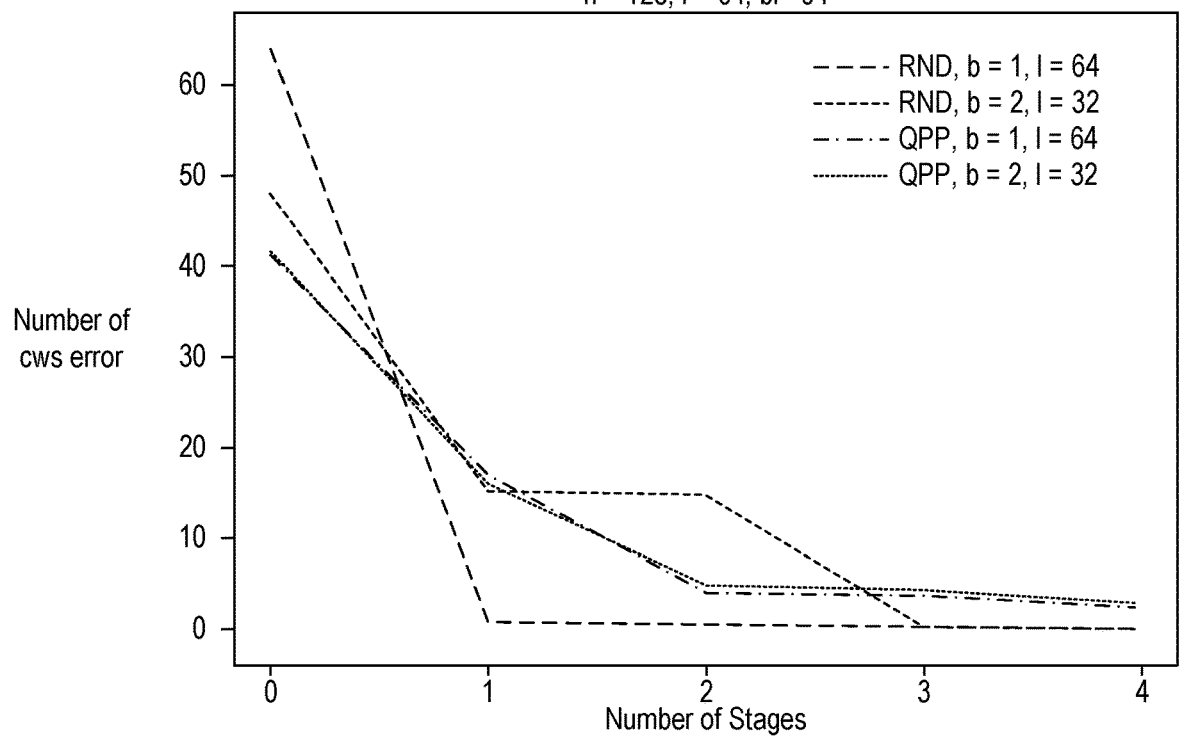
FIG. 9 is a graph illustrating an example of a performance of a network using iterative GRAND burst discovery according to some embodiments of inventive concepts.

FIG. 9 illustrates performance for fixed codeword length n and number of codewords I in the frame, and different values for the number of error bursts b and length of each burst l such that b*l is fixed.

In FIG. 9, l=64 codewords of length n=128 bits. The total number of bits in error (=in error bursts) is fixed and equal to 64. The number of error bursts b and the length of each burst l change. Random (RND) and quadratic permutation polynomial (QPP) interleavers can be compared for fixed n, I, and b*l product. First, it can be seen that in all cases the number of codewords in error rapidly decreases, and after the first 3 stages (even without the majority heuristic), about 90% of the codewords in error have been corrected. Second, depending on the interleaver chosen the performance changes.

For the QPP interleaver used, which is characterized by a minimum spread between two consecutive bits equal to 128, errors in a burst are spread over different codewords; therefore, on average, b=1 burst of length l=64 bits over l=64 codewords is transformed to 1 error per codeword with QPP, which is why after the first stage all codewords are corrected. With 2 error bursts of length 32 bits the situation is different because there may be cases where some codewords are affected by 2 errors and some codewords are not affected by errors at all; in this case, to correct most codewords one has to get at stage 3.

The RND interleaver is random in the sense that the probability that any bit is in error is uniform and equal to 1/(n*I). By properties of point processes, this also means that the inter-error distance is approximately exponentially distributed, and thus it is expected that some codewords will be affected by more than 1 error even if there are only I bits in error over the entire transport block. This is why after all four decoding stages are completed, the RND interleaver is expected to perform worse than the QPP interleaver.

Figure 10:
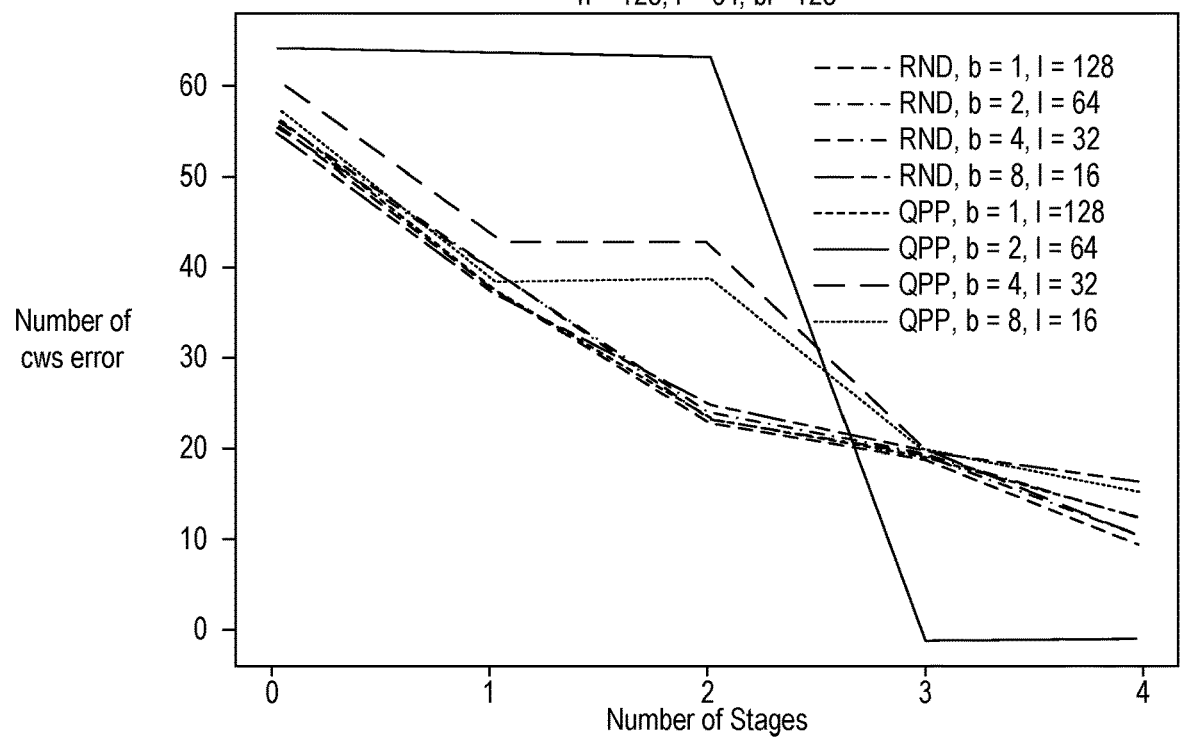
FIG. 10 is a graph illustrating another example of a performance of a network using iterative GRAND burst discovery, in which a number of bursts time a length of each burst is increased, according to some embodiments of inventive concepts.

FIG. 10 is similar to FIG. 9, but illustrates an increased product b times I. In this graph, QPP with b=1 and b=2 almost coincide.

If the product b*l is increased, there are more bits in error in the frame. As before, QPP can recover essentially all errors with two guesses when there is 1 burst only. On the other hand, since all codewords see uniformly 2 errors, the single-error guess is quite ineffective (the reason why QPP with b=1 and b=2 coincide is because the length b*l and n coincide). As the scenario moves towards shorter error bursts, as shown in figure for l=16 and l=32, then QPP gets closer to RND.

Figure 11:
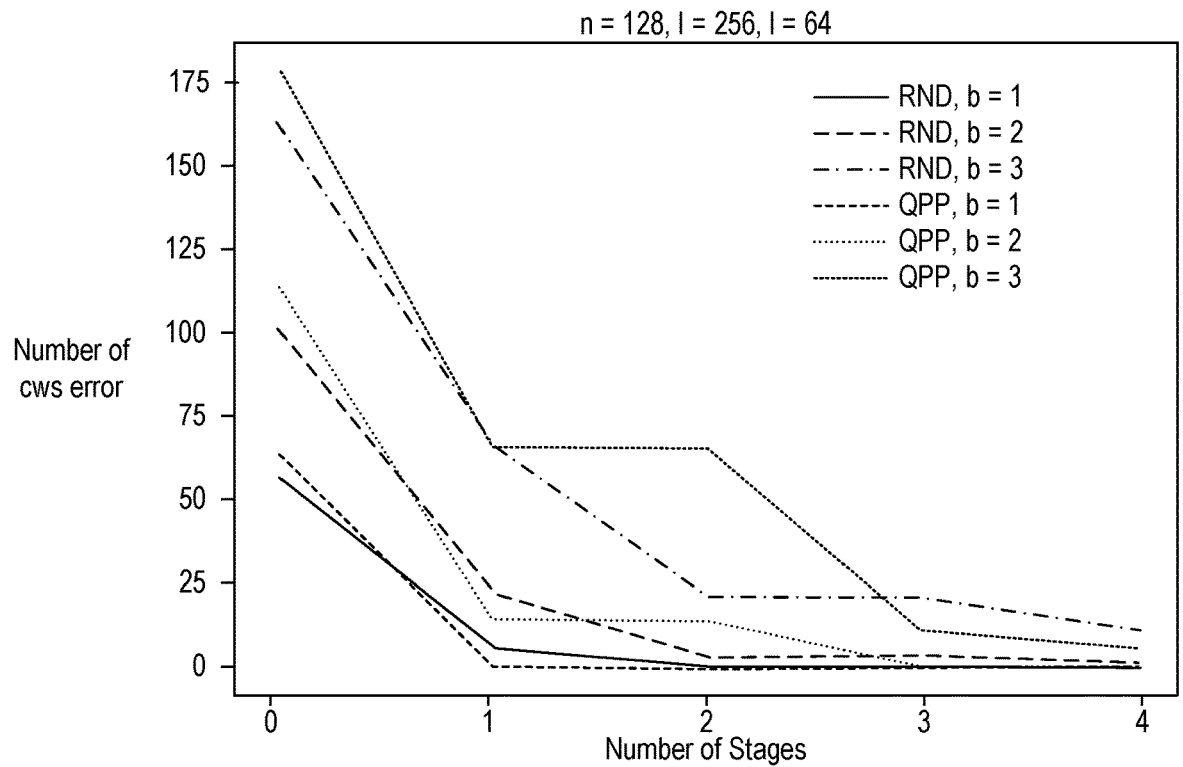
FIG. 11 is a graph illustrating another example of a performance of a network using iterative GRAND burst discovery, in which a number of bursts time a length of each burst is increased, according to some embodiments of inventive concepts.

FIG. 11 illustrates longer frames and less errors. In FIG. 11, the performance with less severe channel conditions is illustrated. The length of each burst is half-codeword length. With QPP, the number of errors per codeword is almost always ≤b, therefore 1-GRAND corrects all errors when b=1; 2-GRAND corrects all errors with b=2; etc. With random interleaving, there is more variance in the number of errors per codeword, thus most errors, but not all, are corrected by 1-GRAND when b=1; by 2-GRAND when b=2; etc.

Figure 12:
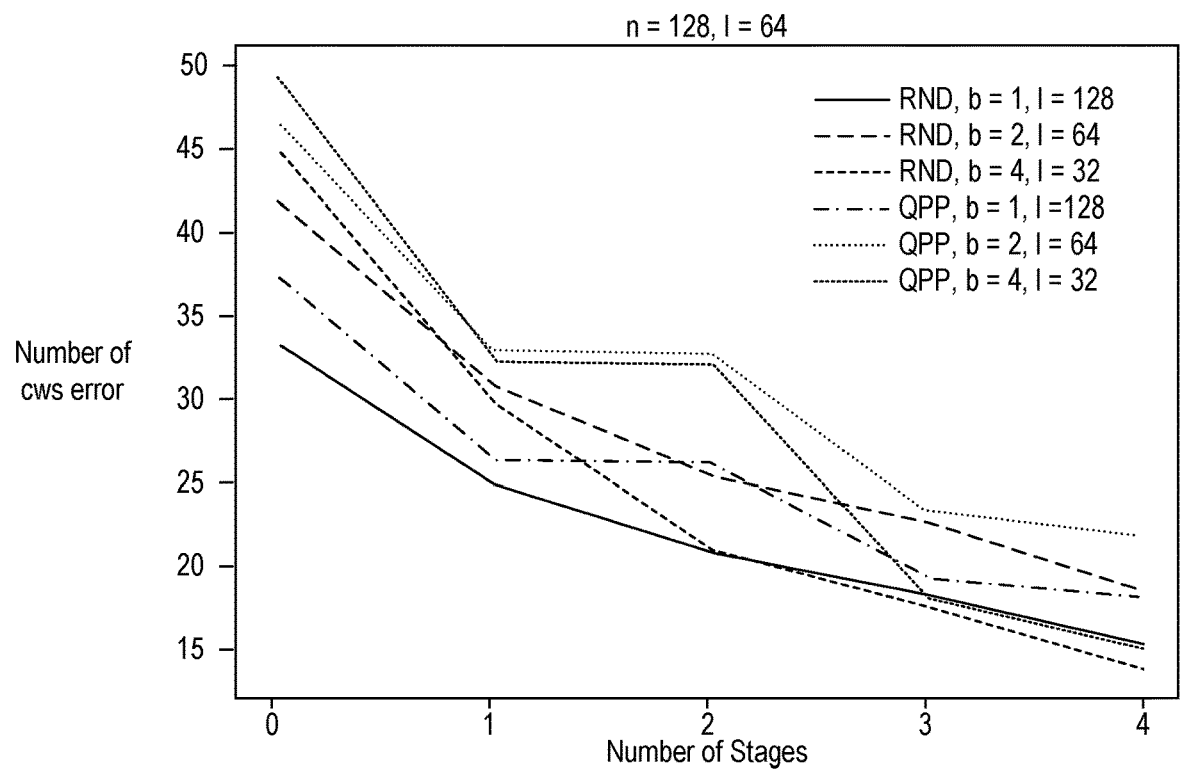
FIG. 12 is a graph illustrating another example of a performance of a network using iterative GRAND burst discovery, using a Gilbert-Elliott model according to some embodiments of inventive concepts.
Figure 13:
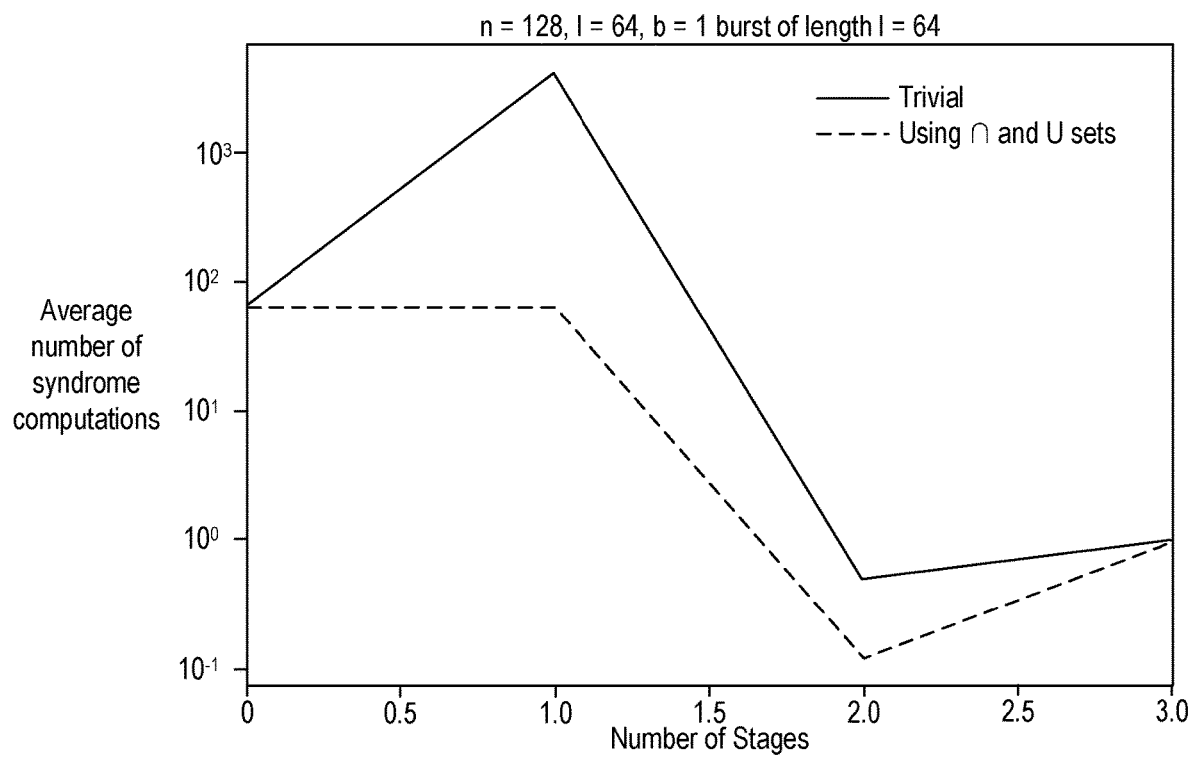
FIG. 13 is a graph illustrating an example of a number of computations required by a message passing decoder to correctly decode a Wi-Fi code according to some embodiments of inventive concepts.

FIG. 12 shows performance achieved under the assumption that the channel is bursty according to a Gilbert-Elliott model with appropriate parameters. The rationale to show results with another model is to provide evidence that 1) the assertion that the number of codewords that are still in error after a few deinterleaving-decoding stages is much lower than the number straight out of the channel; 2) the burst extension methods that are proposed are still effective for the random interleaver; and 3) an appropriate design of the interleaver is expected to improve performance.

These results have to be regarded as achievability results that could be improved via 1) appropriate interleaving design and 2) improved burst extension methods.

$$R = 1/2$$
$$n = 128$$
$$I = 64 \quad In = 8192$$
$$(n, I, b, l) = (128, 64, 1, 64)$$

The number of stages can be fixed to 2 plus a message passing decoding stage after stage 2 on words that are still in error. The proposed approach resolves almost all errors after stage 1 with a QPP interleaver and all errors after stage 3.

$$2I = 128$$
$$(n, I, b, l) = (128, 64, 2, 32)$$

Figure 14:
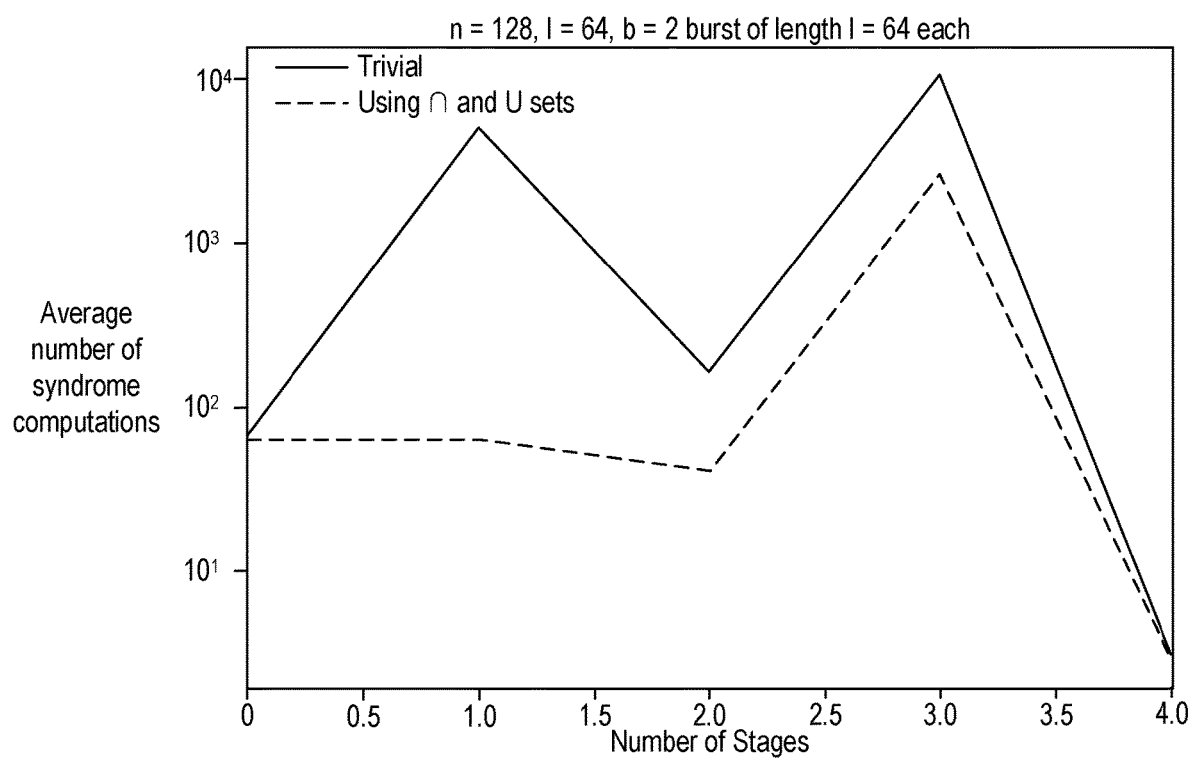
FIG. 14 is a graph illustrating another example of a number of computations required by a message passing decoder to correctly decode a Wi-Fi code according to some embodiments of inventive concepts.

The proposed approach resolves all errors, on average, at stage 3 with a QPP interleaver. The number of computations required is, on average, shown in FIG. 14.

The number of computations required by the message passing decoder to correctly decode the Wi-Fi code is 1, 2, or 3 with probability approximately 80%, 18%, and 2%, and thus an average of about 1.25 iterations and 340 syndrome-equivalent computations (as above, a syndrome computation refers to the short block). In terms of computations, an early stopped message passing decoder may require about one-third of the syndrome computations, but as highlighted above the overhead is not counted due to early stopping.

In some embodiments, the proposed approach is an alternative to traditional decoding in the sense that it can resolve all bit errors in the examples under consideration (high enough signal-to-noise ratios). In some examples, it can resolve some errors, and it has been shown that it can be used jointly with traditional decoding, where the latter is used to decode the words that are still in errors.

The computational complexity of the proposed approach is in some examples comparable to an early stopped message passing decoder. In practice, message passing decoders may not be early stopped, rather they are used for a fixed number of message-passing iterations that is predetermined (e.g., when the decoder is used, it proceeds for 20 or 40 iterations). An early-stop check made at each iteration requires overhead that is implementation specific. In some hardware implementations, it is impossible to stop early because the decoder is unrolled and mapped to silicon or is it only possible to stop early at multiples of iterations. All of these details cannot be taken into account but should be emphasized. For example, if the traditional decoder doesn't use early stopping, then the proposed algorithm can perform much better.

In additional or alternative embodiments, the proposed approach is not in opposition to traditional approaches (e.g., message passing-based). It can be used in place of, but also alongside, traditional decoders.

In additional or alternative embodiments, the proposed approach can be used along any block code and is not limited to LDPC. As such, it is quite general, and it could be used in the future irrespective of the specific block code that will enter the standard.

Figure 15:
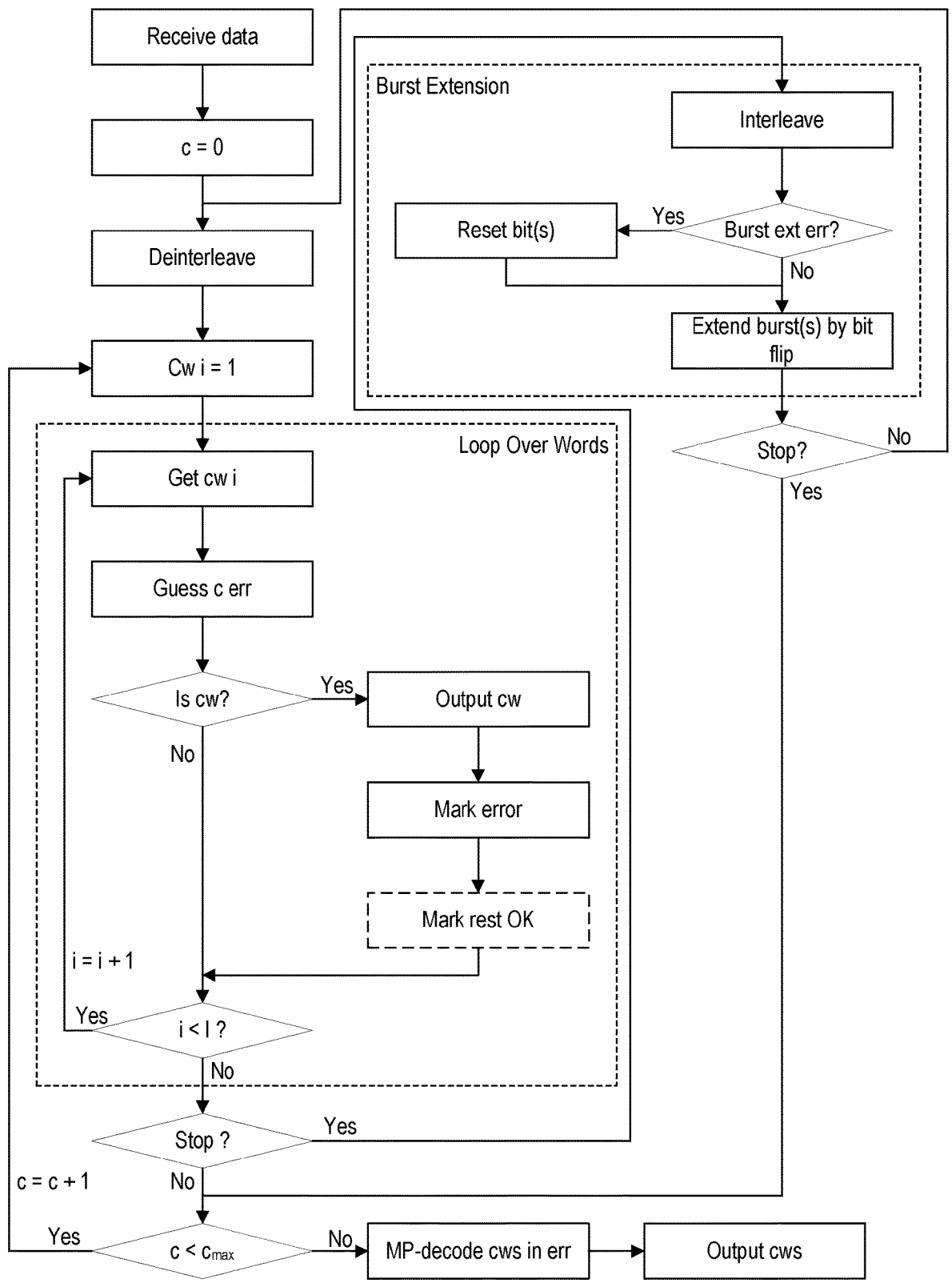
FIG. 15 is a flow chart illustrating an example of operations in which an outer loop over the number of errors to correct and an inner loop over error correlation and burst extension according to some embodiments of inventive concepts.
Figure 16:
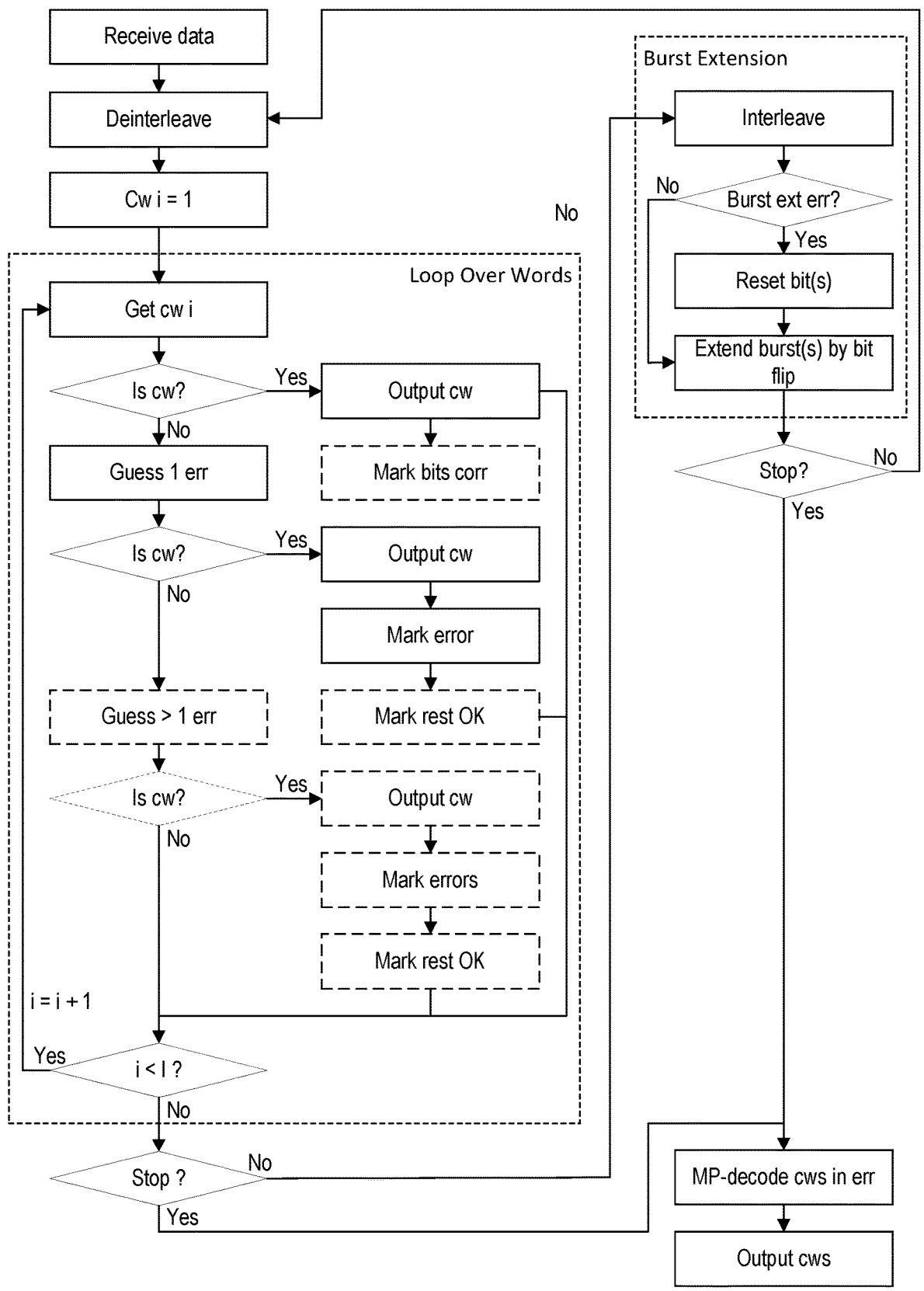
FIG. 16 is a flow chart illustrating an example of operations in which the number of errors to decode as a part of the inner loop according to some embodiments of inventive concepts.

A description of the flow charts of FIGS. 15-16 are described below. The operations at the receiver include iteratively deinterleaving the transport block and separating the bit sequence into separate words, checking whether the words are indeed codewords or can be decoded by correcting a single error (in some embodiments more errors), identifying corrected bits, re-interleaving (at least) the erroneous bits, expanding the erroneous bits since they are parts of error bursts, and repeating the process until a stopping criterion is met.

FIG. 15 illustrates an example of a decoding procedure with an outer loop over the number of errors to correct and an inner loop over error correction and burst extension. The received sequence is deinterleaved. Conceptually, the whole received sequence and all involved codewords are deinterleaved and re-interleaved. Practically, the processing may be limited by only doing a full deinterleaving after the initial reception and thereafter only keeping track of the indices and only doing the interleaving/deinterleaving of relevant indices.

The block of received values are separated into words of length n, the codeword length of the used code.

In the Outer loop, set the number of errors to be corrected, c, to zero, c=0 and deinterleave the received sequence.

In the Decoding part, for each word, guess c errors and check if the word is a codeword.

In the first iteration when c=0, this amounts to checking if the word is received correctly. In some embodiments, this is done with the "code membership function". In additional or alternative embodiments, this is done with a syndrome computation.

In later iterations when c>0 a GRAND decoder is run and makes guesses to correct c errors. In some examples, a GRAND decoder has complexity O(nc). IN other examples, a GRAND decoder using single-error correction amounts to a single bit flip, or in rare cases a small number of bit flips, and also for multiple errors also provides complexity savings.

If the word is received as a codeword, then no further decoding is required and this codeword is outputted for further processing/use in the communication system. If the word is corrected by c bit-flips, output the codeword and keep track of which bit was flipped to correct the word.

In some embodiments, the correct bits in the word are also tracked. The correct bits can be useful in delimiting bursts in the received sequence.

In additional or alternative embodiments, flags are used to mark all received bits as correct, erroneous, or unknown. These flags can be used in a burst extension algorithm.

When all words have been processed as described above, it can be determined whether one or more stopping criteria has been met. Examples of stopping criteria include, but are not limited to: 1) If all codewords have been corrected; 2) If no codewords have been corrected during this iteration; 3) If no codewords have been corrected during this iteration and no further burst extension can/will/should take place; and 4) If a maximum number of iterations have been performed.

In the burst extension part, the bit sequence is re-interleaved to restore the transmitted sequence. If, in a previous iteration, it is hypothesized that some bit(s) were in error and flipped the bit(s) and the decoding step showed that the hypothesis/bit-flip was wrong, restore the flip. In some embodiments, the flip may not be immediately restored and instead the number of flipped bits can be increased (e.g., extend the error burst).

Since the channel has error bursts, the one or more corrected bit(s) is/are the starting point(s) for burst extension. There are several methods to extend the bursts. Some examples are given here but additional burst extension operations are possible.

The basic burst extension ("transition logic") is to find a transition from known error to an unknown bit, or vice versa. In some examples, the unknown bit adjacent to a burst is also in error. The value of the received bit can be flipped (0 to 1, or 1 to 0 for a binary channel, change the sign of the log likelihood ratio (LLR) for a continuous channel), deinterleave and try to decode the corresponding codeword. If the decoding is unsuccessful due to the codeword having multiple errors, the bit can be reset to its original value or the burst can be extended one bit further. Actual choices can depend on the channel properties.

In some embodiments, a "filter" is used based on the neighbors to extend the bursts ("majority logic"). If the probability of a sequence of length 1 (either correct bits or error bursts) is very small, then it can be hypothesized that one-bit long sequences of unknown bits are the same as its known surroundings. For example, one unknown bit in a sequence of errors can be hypothesized to be in error, and one unknown bit in a sequence of correct bits can be assumed to be correct. This can be referred to as majority logic. Depending on the characteristics of the channel, the length of the unknown sequence to be hypothesized can be more than one bit.

In some embodiments, the system uses slotted transmissions, for example, resource blocks in 3GPP LTE and NR. The bursts can then be assumed to be aligned with the resource blocks. At least two examples can be considered, either the entire slot is in error, or the probability of error in the slot is significantly higher than the average. In both examples, burst extension beyond the slot boundaries is unlikely and the burst extension algorithm can consider this. If the entire slot behaves in the same way (e.g., either completely error free or completely in error), the burst extension algorithm can set the entire slot to be correct or in error ("whole block burst logic") as soon as a single bit in the slot is known to be correct or in error.

When one or more bursts have been extended by flipping bits, the sequence is deinterleaved and the procedure returns to decoding. If all burst extension possibilities are explored and no flips have been done, the procedure can be flagged for the stopping criteria described above or terminate the operations here.

If the burst has been extended then the decoding procedure can continue with the inner loop and return to the deinterleaving step.

If all burst extension logics have been tried and no burst extension has taken place in this iteration, continue with the outer loop and increase the number of errors to correct c:=c+1. If c exceeds a limit cmax the procedure can end, otherwise an inner loop can be started.

If after termination of the outer loop, one or more codewords still remain in error they can be passed to a MP decoder or a retransmission can be triggered. If after MP decoding, still error remains, a retransmission is triggered, otherwise the decoded codewords are outputted.

FIG. 16 illustrates an example of a decoding operation in which the number of errors to check/correct is set in the inner loop. The processing is as described above with the difference that in the decoding part, for each codeword: 1) Check if the word is a codeword (e.g., received correctly); 2) If the word is indeed a codeword, no further decoding is required and this codeword is outputted for further processing/use in the communication system; 3) If the word is not a codeword, a GRAND decoder is run on the word, and first check if the word is subject to a single error; 4) If the word was not corrected by a single bit-flip, try to correct multiple errors up to some limit Machine Learning utilization is described below. A machine learning algorithm can be used to improve the burst extension algorithm. For example, the ML algorithm can learn the channel characteristics, such as mean and average of burst lengths, or the flip patterns that occur in the system. In general, all kinds of side information can be used, either by an ML algorithm or the algorithm designer, to improve the burst extension algorithm.

Figure 22:
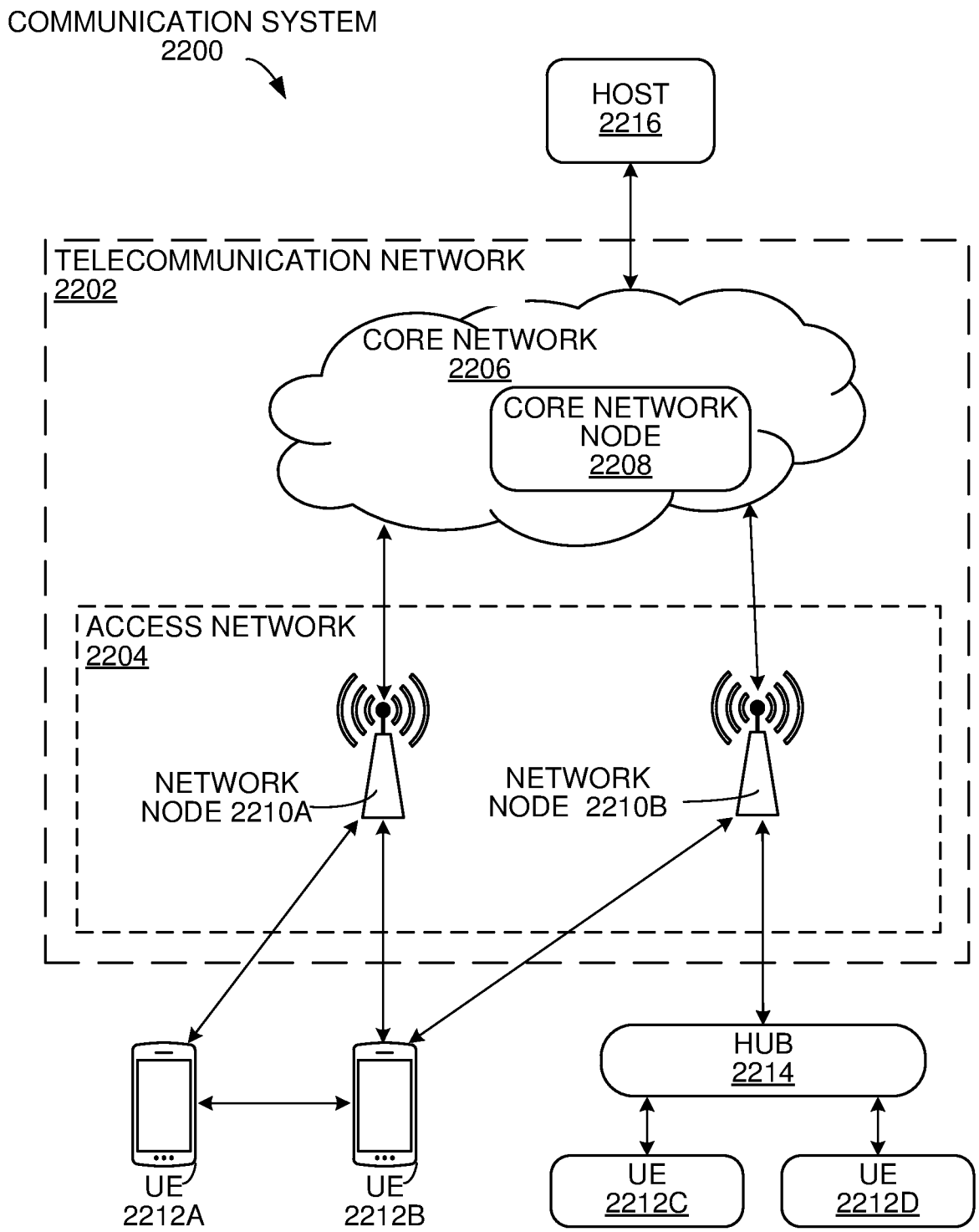
FIG. 22 is a block diagram of a communication system in accordance with some embodiments.

FIG. 22 shows an example of a communication system 2200 in accordance with some embodiments.

In the example, the communication system 2200 includes a telecommunication network 2202 that includes an access network 2204, such as a radio access network (RAN), and a core network 2206, which includes one or more core network nodes 2208. The access network 2204 includes one or more access network nodes, such as network nodes 2210a and 2210b (one or more of which may be generally referred to as network nodes 2210), or any other similar $3^{rd}$ Generation Partnership Project (3GPP) access node or non-3GPP access point. The network nodes 2210 facilitate direct or indirect connection of user equipment (UE), such as by connecting UEs 2212a, 2212b, 2212c, and 2212d (one or more of which may be generally referred to as UEs 2212) to the core network 2206 over one or more wireless connections.

Example wireless communications over a wireless connection include transmitting and/or receiving wireless signals using electromagnetic waves, radio waves, infrared waves, and/or other types of signals suitable for conveying information without the use of wires, cables, or other material conductors. Moreover, in different embodiments, the communication system 2200 may include any number of wired or wireless networks, network nodes, UEs, and/or any other components or systems that may facilitate or participate in the communication of data and/or signals whether via wired or wireless connections. The communication system 2200 may include and/or interface with any type of communication, telecommunication, data, cellular, radio network, and/or other similar type of system.

The UEs 2212 may be any of a wide variety of communication devices, including wireless devices arranged, configured, and/or operable to communicate wirelessly with the network nodes 2210 and other communication devices. Similarly, the network nodes 2210 are arranged, capable, configured, and/or operable to communicate directly or indirectly with the UEs 2212 and/or with other network nodes or equipment in the telecommunication network 2202 to enable and/or provide network access, such as wireless network access, and/or to perform other functions, such as administration in the telecommunication network 2202.

In the depicted example, the core network 2206 connects the network nodes 2210 to one or more hosts, such as host 2216. These connections may be direct or indirect via one or more intermediary networks or devices. In other examples, network nodes may be directly coupled to hosts. The core network 2206 includes one more core network nodes (e.g., core network node 2208) that are structured with hardware and software components. Features of these components may be substantially similar to those described with respect to the UEs, network nodes, and/or hosts, such that the descriptions thereof are generally applicable to the corresponding components of the core network node 2208. Example core network nodes include functions of one or more of a Mobile Switching Center (MSC), Mobility Management Entity (MME), Home Subscriber Server (HSS), Access and Mobility Management Function (AMF), Session Management Function (SMF), Authentication Server Function (AUSF), Subscription Identifier De-concealing function (SIDF), Unified Data Management (UDM), Security Edge Protection Proxy (SEPP), Network Exposure Function (NEF), and/or a User Plane Function (UPF).

The host 2216 may be under the ownership or control of a service provider other than an operator or provider of the access network 2204 and/or the telecommunication network 2202, and may be operated by the service provider or on behalf of the service provider. The host 2216 may host a variety of applications to provide one or more service. Examples of such applications include live and pre-recorded audio/video content, data collection services such as retrieving and compiling data on various ambient conditions detected by a plurality of UEs, analytics functionality, social media, functions for controlling or otherwise interacting with remote devices, functions for an alarm and surveillance center, or any other such function performed by a server.

As a whole, the communication system 2200 of FIG. 22 enables connectivity between the UEs, network nodes, and hosts. In that sense, the communication system may be configured to operate according to predefined rules or procedures, such as specific standards that include, but are not limited to: Global System for Mobile Communications (GSM); Universal Mobile Telecommunications System (UMTS); Long Term Evolution (LTE), and/or other suitable 2G, 3G, 4G, 5G standards, or any applicable future generation standard (e.g., 6G); wireless local area network (WLAN) standards, such as the Institute of Electrical and Electronics Engineers (IEEE) 802.11 standards (WiFi); and/or any other appropriate wireless communication standard, such as the Worldwide Interoperability for Microwave Access (WiMax), Bluetooth, Z-Wave, Near Field Communication (NFC) ZigBee, LiFi, and/or any low-power wide-area network (LPWAN) standards such as LoRa and Sigfox.

In some examples, the telecommunication network 2202 is a cellular network that implements 3GPP standardized features. Accordingly, the telecommunications network 2202 may support network slicing to provide different logical networks to different devices that are connected to the telecommunication network 2202. For example, the telecommunications network 2202 may provide Ultra Reliable Low Latency Communication (URLLC) services to some UEs, while providing Enhanced Mobile Broadband (eMBB) services to other UEs, and/or Massive Machine Type Communication (mMTC)/Massive IoT services to yet further UEs.

In some examples, the UEs 2212 are configured to transmit and/or receive information without direct human interaction. For instance, a UE may be designed to transmit information to the access network 2204 on a predetermined schedule, when triggered by an internal or external event, or in response to requests from the access network 2204. Additionally, a UE may be configured for operating in single- or multi-RAT or multi-standard mode. For example, a UE may operate with any one or combination of Wi-Fi, NR (New Radio) and LTE, i.e. being configured for multi-radio dual connectivity (MR-DC), such as E-UTRAN (Evolved-UMTS Terrestrial Radio Access Network) New Radio-Dual Connectivity (EN-DC).

In the example, the hub 2214 communicates with the access network 2204 to facilitate indirect communication between one or more UEs (e.g., UE 2212c and/or 2212d) and network nodes (e.g., network node 2210b). In some examples, the hub 2214 may be a controller, router, content source and analytics, or any of the other communication devices described herein regarding UEs. For example, the hub 2214 may be a broadband router enabling access to the core network 2206 for the UEs. As another example, the hub 2214 may be a controller that sends commands or instructions to one or more actuators in the UEs. Commands or instructions may be received from the UEs, network nodes 2210, or by executable code, script, process, or other instructions in the hub 2214. As another example, the hub 2214 may be a data collector that acts as temporary storage for UE data and, in some embodiments, may perform analysis or other processing of the data. As another example, the hub 2214 may be a content source. For example, for a UE that is a VR headset, display, loudspeaker or other media delivery device, the hub 2214 may retrieve VR assets, video, audio, or other media or data related to sensory information via a network node, which the hub 2214 then provides to the UE either directly, after performing local processing, and/or after adding additional local content. In still another example, the hub 2214 acts as a proxy server or orchestrator for the UEs, in particular in if one or more of the UEs are low energy IoT devices.

The hub 2214 may have a constant/persistent or intermittent connection to the network node 2210*b*. The hub 2214 may also allow for a different communication scheme and/or schedule between the hub 2214 and UEs (e.g., UE 2212*c* and/or 2212*d*), and between the hub 2214 and the core network 2206. In other examples, the hub 2214 is connected to the core network 2206 and/or one or more UEs via a wired connection. Moreover, the hub 2214 may be configured to connect to an M2M service provider over the access network 2204 and/or to another UE over a direct connection. In some scenarios, UEs may establish a wireless connection with the network nodes 2210 while still connected via the hub 2214 via a wired or wireless connection. In some embodiments, the hub 2214 may be a dedicated hub—that is, a hub whose primary function is to route communications to/from the UEs from/to the network node 2210*b*. In other embodiments, the hub 2214 may be a non-dedicated hub—that is, a device which is capable of operating to route communications between the UEs and network node 2210*b*, but which is additionally capable of operating as a communication start and/or end point for certain data channels.

Figure 23:
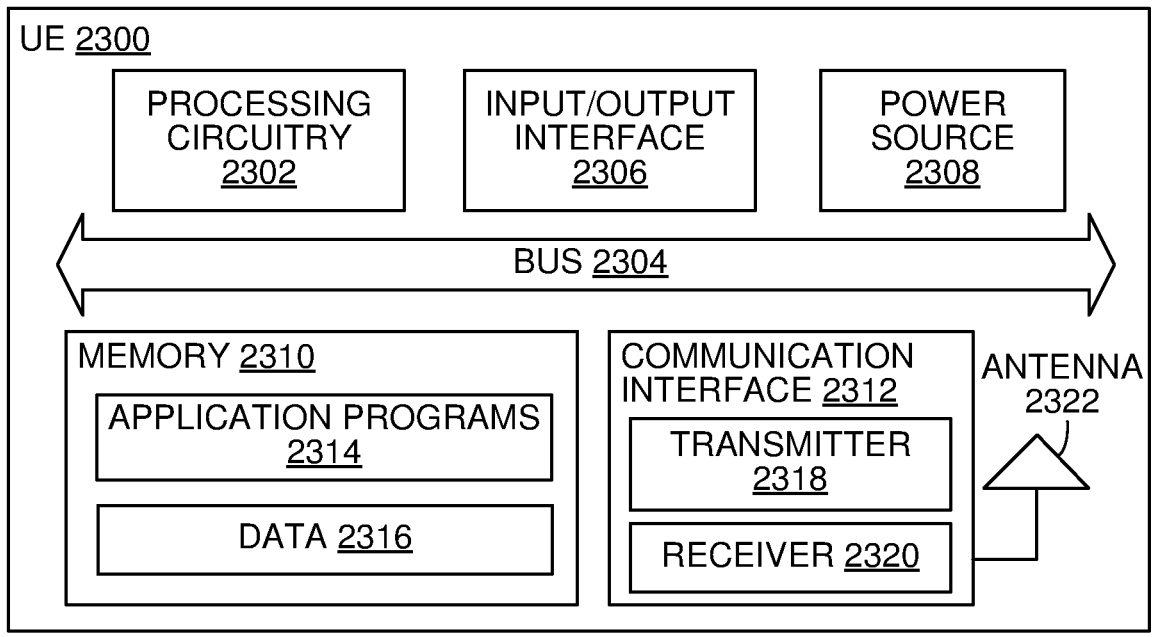
FIG. 23 is a block diagram of a user equipment in accordance with some embodiments

FIG. 23 shows a UE 2300 in accordance with some embodiments. As used herein, a UE refers to a device capable, configured, arranged and/or operable to communicate wirelessly with network nodes and/or other UEs. Examples of a UE include, but are not limited to, a smart phone, mobile phone, cell phone, voice over IP (VOIP) phone, wireless local loop phone, desktop computer, personal digital assistant (PDA), wireless cameras, gaming console or device, music storage device, playback appliance, wearable terminal device, wireless endpoint, mobile station, tablet, laptop, laptop-embedded equipment (LEE), laptop-mounted equipment (LME), smart device, wireless customer-premise equipment (CPE), vehicle-mounted or vehicle embedded/integrated wireless device, etc. Other examples include any UE identified by the 3$^{rd}$ Generation Partnership Project (3GPP), including a narrow band internet of things (NB-IOT) UE, a machine type communication (MTC) UE, and/or an enhanced MTC (eMTC) UE.

A UE may support device-to-device (D2D) communication, for example by implementing a 3GPP standard for sidelink communication, Dedicated Short-Range Communication (DSRC), vehicle-to-vehicle (V2V), vehicle-to-infrastructure (V2I), or vehicle-to-everything (V2X). In other examples, a UE may not necessarily have a user in the sense of a human user who owns and/or operates the relevant device. Instead, a UE may represent a device that is intended for sale to, or operation by, a human user but which may not, or which may not initially, be associated with a specific human user (e.g., a smart sprinkler controller). Alternatively, a UE may represent a device that is not intended for sale to, or operation by, an end user but which may be associated with or operated for the benefit of a user (e.g., a smart power meter).

The UE 2300 includes processing circuitry 2302 that is operatively coupled via a bus 2304 to an input/output interface 2306, a power source 2308, a memory 2310, a communication interface 2312, and/or any other component, or any combination thereof. Certain UEs may utilize all or a subset of the components shown in FIG. 23. The level of integration between the components may vary from one UE to another UE. Further, certain UEs may contain multiple instances of a component, such as multiple processors, memories, transceivers, transmitters, receivers, etc.

The processing circuitry 2302 is configured to process instructions and data and may be configured to implement any sequential state machine operative to execute instructions stored as machine-readable computer programs in the memory 2310. The processing circuitry 2302 may be implemented as one or more hardware-implemented state machines (e.g., in discrete logic, field-programmable gate arrays (FPGAs), application specific integrated circuits (ASICs), etc.); programmable logic together with appropriate firmware; one or more stored computer programs, general-purpose processors, such as a microprocessor or digital signal processor (DSP), together with appropriate software; or any combination of the above. For example, the processing circuitry 2302 may include multiple central processing units (CPUs).

In the example, the input/output interface 2306 may be configured to provide an interface or interfaces to an input device, output device, or one or more input and/or output devices. Examples of an output device include a speaker, a sound card, a video card, a display, a monitor, a printer, an actuator, an emitter, a smartcard, another output device, or any combination thereof. An input device may allow a user to capture information into the UE 2300. Examples of an input device include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, a biometric sensor, etc., or any combination thereof. An output device may use the same type of interface port as an input device. For example, a Universal Serial Bus (USB) port may be used to provide an input device and an output device.

In some embodiments, the power source 2308 is structured as a battery or battery pack. Other types of power sources, such as an external power source (e.g., an electricity outlet), photovoltaic device, or power cell, may be used. The power source 2308 may further include power circuitry for delivering power from the power source 2308 itself, and/or an external power source, to the various parts of the UE 2300 via input circuitry or an interface such as an electrical power cable. Delivering power may be, for example, for charging of the power source 2308. Power circuitry may perform any formatting, converting, or other modification to the power from the power source 2308 to make the power suitable for the respective components of the UE 2300 to which power is supplied.

The memory 2310 may be or be configured to include memory such as random access memory (RAM), read-only memory (ROM), programmable read-only memory (PROM), erasable programmable read-only memory (EPROM), electrically erasable programmable read-only memory (EEPROM), magnetic disks, optical disks, hard disks, removable cartridges, flash drives, and so forth. In one example, the memory 2310 includes one or more application programs 2314, such as an operating system, web browser application, a widget, gadget engine, or other application, and corresponding data 2316. The memory 2310 may store, for use by the UE 2300, any of a variety of various operating systems or combinations of operating systems.

The memory 2310 may be configured to include a number of physical drive units, such as redundant array of independent disks (RAID), flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as tamper resistant module in the form of a universal integrated circuit card (UICC) including one or more subscriber identity modules (SIMs), such as a USIM and/or ISIM, other memory, or any combination thereof. The UICC may for example be an embedded UICC (eUICC), integrated UICC (iUICC) or a removable UICC commonly known as 'SIM card.' The memory 2310 may allow the UE 2300 to access instructions, application programs and the like, stored on transitory or non-transitory memory media, to off-load data, or to upload data. An article of manufacture, such as one utilizing a communication system may be tangibly embodied as or in the memory 2310, which may be or comprise a device-readable storage medium.

The processing circuitry 2302 may be configured to communicate with an access network or other network using the communication interface 2312. The communication interface 2312 may comprise one or more communication subsystems and may include or be communicatively coupled to an antenna 2322. The communication interface 2312 may include one or more transceivers used to communicate, such as by communicating with one or more remote transceivers of another device capable of wireless communication (e.g., another UE or a network node in an access network). Each transceiver may include a transmitter 2318 and/or a receiver 2320 appropriate to provide network communications (e.g., optical, electrical, frequency allocations, and so forth). Moreover, the transmitter 2318 and receiver 2320 may be coupled to one or more antennas (e.g., antenna 2322) and may share circuit components, software or firmware, or alternatively be implemented separately.

In the illustrated embodiment, communication functions of the communication interface 2312 may include cellular communication, Wi-Fi communication, LPWAN communication, data communication, voice communication, multimedia communication, short-range communications such as Bluetooth, near-field communication, location-based communication such as the use of the global positioning system (GPS) to determine a location, another like communication function, or any combination thereof. Communications may be implemented in according to one or more communication protocols and/or standards, such as IEEE 802.11, Code Division Multiplexing Access (CDMA), Wideband Code Division Multiple Access (WCDMA), GSM, LTE, New Radio (NR), UMTS, WiMax, Ethernet, transmission control protocol/internet protocol (TCP/IP), synchronous optical networking (SONET), Asynchronous Transfer Mode (ATM), QUIC, Hypertext Transfer Protocol (HTTP), and so forth.

Regardless of the type of sensor, a UE may provide an output of data captured by its sensors, through its communication interface 2312, via a wireless connection to a network node. Data captured by sensors of a UE can be communicated through a wireless connection to a network node via another UE. The output may be periodic (e.g., once every 15 minutes if it reports the sensed temperature), random (e.g., to even out the load from reporting from several sensors), in response to a triggering event (e.g., when moisture is detected an alert is sent), in response to a request (e.g., a user initiated request), or a continuous stream (e.g., a live video feed of a patient).

As another example, a UE comprises an actuator, a motor, or a switch, related to a communication interface configured to receive wireless input from a network node via a wireless connection. In response to the received wireless input the states of the actuator, the motor, or the switch may change. For example, the UE may comprise a motor that adjusts the control surfaces or rotors of a drone in flight according to the received input or to a robotic arm performing a medical procedure according to the received input.

A UE, when in the form of an Internet of Things (IOT) device, may be a device for use in one or more application domains, these domains comprising, but not limited to, city wearable technology, extended industrial application and healthcare. Non-limiting examples of such an IoT device are a device which is or which is embedded in: a connected refrigerator or freezer, a TV, a connected lighting device, an electricity meter, a robot vacuum cleaner, a voice controlled smart speaker, a home security camera, a motion detector, a thermostat, a smoke detector, a door/window sensor, a flood/moisture sensor, an electrical door lock, a connected doorbell, an air conditioning system like a heat pump, an autonomous vehicle, a surveillance system, a weather monitoring device, a vehicle parking monitoring device, an electric vehicle charging station, a smart watch, a fitness tracker, a head-mounted display for Augmented Reality (AR) or Virtual Reality (VR), a wearable for tactile augmentation or sensory enhancement, a water sprinkler, an animal- or item-tracking device, a sensor for monitoring a plant or animal, an industrial robot, an Unmanned Aerial Vehicle (UAV), and any kind of medical device, like a heart rate monitor or a remote controlled surgical robot. A UE in the form of an IoT device comprises circuitry and/or software in dependence of the intended application of the IoT device in addition to other components as described in relation to the UE 2300 shown in FIG. 23.

As yet another specific example, in an IoT scenario, a UE may represent a machine or other device that performs monitoring and/or measurements, and transmits the results of such monitoring and/or measurements to another UE and/or a network node. The UE may in this case be an M2M device, which may in a 3GPP context be referred to as an MTC device. As one particular example, the UE may implement the 3GPP NB-IOT standard. In other scenarios, a UE may represent a vehicle, such as a car, a bus, a truck, a ship and an airplane, or other equipment that is capable of monitoring and/or reporting on its operational status or other functions associated with its operation.

In practice, any number of UEs may be used together with respect to a single use case. For example, a first UE might be or be integrated in a drone and provide the drone's speed information (obtained through a speed sensor) to a second UE that is a remote controller operating the drone. When the user makes changes from the remote controller, the first UE may adjust the throttle on the drone (e.g. by controlling an actuator) to increase or decrease the drone's speed. The first and/or the second UE can also include more than one of the functionalities described above. For example, a UE might comprise the sensor and the actuator, and handle communication of data for both the speed sensor and the actuators.

Figure 24:
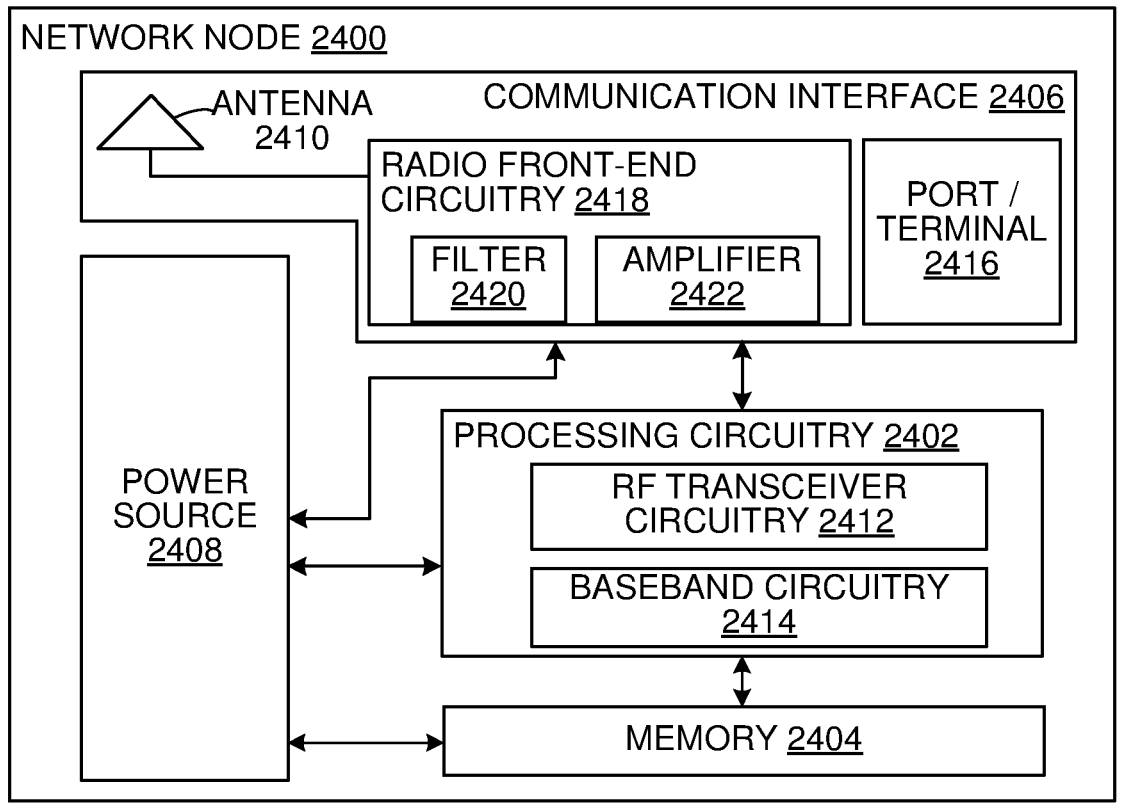
FIG. 24 is a block diagram of a network node in accordance with some embodiments.

FIG. 24 shows a network node 2400 in accordance with some embodiments. As used herein, network node refers to equipment capable, configured, arranged and/or operable to communicate directly or indirectly with a UE and/or with other network nodes or equipment, in a telecommunication network. Examples of network nodes include, but are not limited to, access points (APs) (e.g., radio access points), base stations (BSs) (e.g., radio base stations, Node Bs, evolved Node Bs (eNBs) and NR NodeBs (gNBs)).

Base stations may be categorized based on the amount of coverage they provide (or, stated differently, their transmit power level) and so, depending on the provided amount of coverage, may be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS).

Other examples of network nodes include multiple transmission point (multi-TRP) 5G access nodes, multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), Operation and Maintenance (O&M) nodes, Operations Support System (OSS) nodes, Self-Organizing Network (SON) nodes, positioning nodes (e.g., Evolved Serving Mobile Location Centers (E-SMLCs)), and/or Minimization of Drive Tests (MDTs)).

The network node 2400 includes a processing circuitry 2402, a memory 2404, a communication interface 2406, and a power source 2408. The network node 2400 may be composed of multiple physically separate components (e.g., a NodeB component and a RNC component, or a BTS component and a BSC component, etc.), which may each have their own respective components. In certain scenarios in which the network node 2400 comprises multiple separate components (e.g., BTS and BSC components), one or more of the separate components may be shared among several network nodes. For example, a single RNC may control multiple NodeBs. In such a scenario, each unique NodeB and RNC pair, may in some instances be considered a single separate network node. In some embodiments, the network node 2400 may be configured to support multiple radio access technologies (RATs). In such embodiments, some components may be duplicated (e.g., separate memory 2404 for different RATs) and some components may be reused (e.g., a same antenna 2410 may be shared by different RATs). The network node 2400 may also include multiple sets of the various illustrated components for different wireless technologies integrated into network node 2400, for example GSM, WCDMA, LTE, NR, WiFi, Zigbee, Z-wave, LoRaWAN, Radio Frequency Identification (RFID) or Bluetooth wireless technologies. These wireless technologies may be integrated into the same or different chip or set of chips and other components within network node 2400.

The processing circuitry 2402 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 2400 components, such as the memory 2404, to provide network node 2400 functionality.

In some embodiments, the processing circuitry 2402 includes a system on a chip (SOC). In some embodiments, the processing circuitry 2402 includes one or more of radio frequency (RF) transceiver circuitry 2412 and baseband processing circuitry 2414. In some embodiments, the radio frequency (RF) transceiver circuitry 2412 and the baseband processing circuitry 2414 may be on separate chips (or sets of chips), boards, or units, such as radio units and digital units. In alternative embodiments, part or all of RF transceiver circuitry 2412 and baseband processing circuitry 2414 may be on the same chip or set of chips, boards, or units.

The memory 2404 may comprise any form of volatile or non-volatile computer-readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device-readable and/or computer-executable memory devices that store information, data, and/or instructions that may be used by the processing circuitry 2402. The memory 2404 may store any suitable instructions, data, or information, including a computer program, software, an application including one or more of logic, rules, code, tables, and/or other instructions capable of being executed by the processing circuitry 2402 and utilized by the network node 2400. The memory 2404 may be used to store any calculations made by the processing circuitry 2402 and/or any data received via the communication interface 2406. In some embodiments, the processing circuitry 2402 and memory 2404 is integrated.

The communication interface 2406 is used in wired or wireless communication of signaling and/or data between a network node, access network, and/or UE. As illustrated, the communication interface 2406 comprises port(s)/terminal(s) 2416 to send and receive data, for example to and from a network over a wired connection. The communication interface 2406 also includes radio front-end circuitry 2418 that may be coupled to, or in certain embodiments a part of, the antenna 2410. Radio front-end circuitry 2418 comprises filters 2420 and amplifiers 2422. The radio front-end circuitry 2418 may be connected to an antenna 2410 and processing circuitry 2402. The radio front-end circuitry may be configured to condition signals communicated between antenna 2410 and processing circuitry 2402. The radio front-end circuitry 2418 may receive digital data that is to be sent out to other network nodes or UEs via a wireless connection. The radio front-end circuitry 2418 may convert the digital data into a radio signal having the appropriate channel and bandwidth parameters using a combination of filters 2420 and/or amplifiers 2422. The radio signal may then be transmitted via the antenna 2410. Similarly, when receiving data, the antenna 2410 may collect radio signals which are then converted into digital data by the radio front-end circuitry 2418. The digital data may be passed to the processing circuitry 2402. In other embodiments, the communication interface may comprise different components and/or different combinations of components.

In certain alternative embodiments, the network node 2400 does not include separate radio front-end circuitry 2418, instead, the processing circuitry 2402 includes radio front-end circuitry and is connected to the antenna 2410. Similarly, in some embodiments, all or some of the RF transceiver circuitry 2412 is part of the communication interface 2406. In still other embodiments, the communication interface 2406 includes one or more ports or terminals 2416, the radio front-end circuitry 2418, and the RF transceiver circuitry 2412, as part of a radio unit (not shown), and the communication interface 2406 communicates with the baseband processing circuitry 2414, which is part of a digital unit (not shown).

The antenna 2410 may include one or more antennas, or antenna arrays, configured to send and/or receive wireless signals. The antenna 2410 may be coupled to the radio front-end circuitry 2418 and may be any type of antenna capable of transmitting and receiving data and/or signals wirelessly. In certain embodiments, the antenna 2410 is separate from the network node 2400 and connectable to the network node 2400 through an interface or port.

The antenna 2410, communication interface 2406, and/or the processing circuitry 2402 may be configured to perform any receiving operations and/or certain obtaining operations described herein as being performed by the network node. Any information, data and/or signals may be received from a UE, another network node and/or any other network equipment. Similarly, the antenna 2410, the communication interface 2406, and/or the processing circuitry 2402 may be configured to perform any transmitting operations described herein as being performed by the network node. Any information, data and/or signals may be transmitted to a UE, another network node and/or any other network equipment.

The power source 2408 provides power to the various components of network node 2400 in a form suitable for the respective components (e.g., at a voltage and current level needed for each respective component). The power source 2408 may further comprise, or be coupled to, power management circuitry to supply the components of the network node 2400 with power for performing the functionality described herein. For example, the network node 2400 may be connectable to an external power source (e.g., the power grid, an electricity outlet) via an input circuitry or interface such as an electrical cable, whereby the external power source supplies power to power circuitry of the power source 2408. As a further example, the power source 2408 may comprise a source of power in the form of a battery or battery pack which is connected to, or integrated in, power circuitry. The battery may provide backup power should the external power source fail.

Embodiments of the network node 2400 may include additional components beyond those shown in FIG. 24 for providing certain aspects of the network node's functionality, including any of the functionality described herein and/or any functionality necessary to support the subject matter described herein. For example, the network node 2400 may include user interface equipment to allow input of information into the network node 2400 and to allow output of information from the network node 2400. This may allow a user to perform diagnostic, maintenance, repair, and other administrative functions for the network node 2400.

Figure 25:
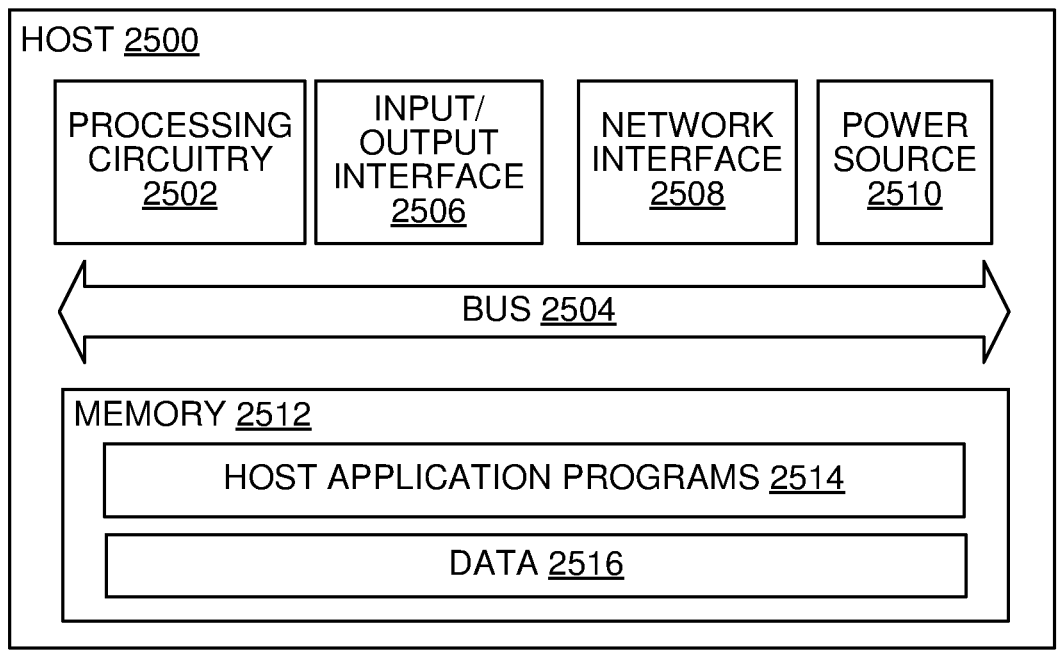
FIG. 25 is a block diagram of a host computer communicating with a user equipment in accordance with some embodiments.

FIG. 25 is a block diagram of a host 2500, which may be an embodiment of the host 2216 of FIG. 22, in accordance with various aspects described herein. As used herein, the host 2500 may be or comprise various combinations hardware and/or software, including a standalone server, a blade server, a cloud-implemented server, a distributed server, a virtual machine, container, or processing resources in a server farm. The host 2500 may provide one or more services to one or more UEs.

The host 2500 includes processing circuitry 2502 that is operatively coupled via a bus 2504 to an input/output interface 2506, a network interface 2508, a power source 2510, and a memory 2512. Other components may be included in other embodiments. Features of these components may be substantially similar to those described with respect to the devices of previous figures, such as FIGS. 23 and 24, such that the descriptions thereof are generally applicable to the corresponding components of host 2500.

The memory 2512 may include one or more computer programs including one or more host application programs 2514 and data 2516, which may include user data, e.g., data generated by a UE for the host 2500 or data generated by the host 2500 for a UE. Embodiments of the host 2500 may utilize only a subset or all of the components shown. The host application programs 2514 may be implemented in a container-based architecture and may provide support for video codecs (e.g., Versatile Video Coding (VVC), High Efficiency Video Coding (HEVC), Advanced Video Coding (AVC), MPEG, VP9) and audio codecs (e.g., FLAC, Advanced Audio Coding (AAC), MPEG, G.711), including transcoding for multiple different classes, types, or implementations of UEs (e.g., handsets, desktop computers, wearable display systems, heads-up display systems). The host application programs 2514 may also provide for user authentication and licensing checks and may periodically report health, routes, and content availability to a central node, such as a device in or on the edge of a core network. Accordingly, the host 2500 may select and/or indicate a different host for over-the-top services for a UE. The host application programs 2514 may support various protocols, such as the HTTP Live Streaming (HLS) protocol, Real-Time Messaging Protocol (RTMP), Real-Time Streaming Protocol (RTSP), Dynamic Adaptive Streaming over HTTP (MPEG-DASH), etc.

Figure 26:
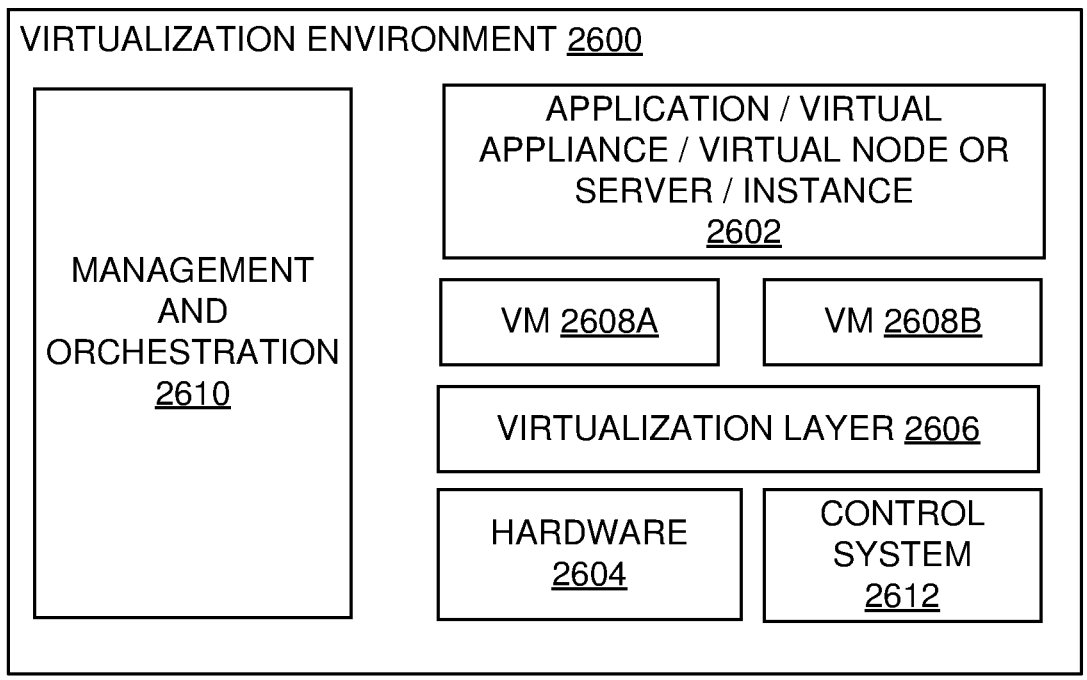
FIG. 26 is a block diagram of a virtualization environment in accordance with some embodiments.

FIG. 26 is a block diagram illustrating a virtualization environment 2600 in which functions implemented by some embodiments may be virtualized. In the present context, virtualizing means creating virtual versions of apparatuses or devices which may include virtualizing hardware platforms, storage devices and networking resources. As used herein, virtualization can be applied to any device described herein, or components thereof, and relates to an implementation in which at least a portion of the functionality is implemented as one or more virtual components. Some or all of the functions described herein may be implemented as virtual components executed by one or more virtual machines (VMs) implemented in one or more virtual environments 2600 hosted by one or more of hardware nodes, such as a hardware computing device that operates as a network node, UE, core network node, or host. Further, in embodiments in which the virtual node does not require radio connectivity (e.g., a core network node or host), then the node may be entirely virtualized.

Applications 2602 (which may alternatively be called software instances, virtual appliances, network functions, virtual nodes, virtual network functions, etc.) are run in the virtualization environment Q400 to implement some of the features, functions, and/or benefits of some of the embodiments disclosed herein.

Hardware 2604 includes processing circuitry, memory that stores software and/or instructions executable by hardware processing circuitry, and/or other hardware devices as described herein, such as a network interface, input/output interface, and so forth. Software may be executed by the processing circuitry to instantiate one or more virtualization layers 2606 (also referred to as hypervisors or virtual machine monitors (VMMs)), provide VMs 2608a and 2608b (one or more of which may be generally referred to as VMs 2608), and/or perform any of the functions, features and/or benefits described in relation with some embodiments described herein. The virtualization layer 2606 may present a virtual operating platform that appears like networking hardware to the VMs 2608.

The VMs 2608 comprise virtual processing, virtual memory, virtual networking or interface and virtual storage, and may be run by a corresponding virtualization layer 2606. Different embodiments of the instance of a virtual appliance 2602 may be implemented on one or more of VMs 2608, and the implementations may be made in different ways. Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, a VM 2608 may be a software implementation of a physical machine that runs programs as if they were executing on a physical, non-virtualized machine. Each of the VMs 2608, and that part of hardware 2604 that executes that VM, be it hardware dedicated to that VM and/or hardware shared by that VM with others of the VMs, forms separate virtual network elements. Still in the context of NFV, a virtual network function is responsible for handling specific network functions that run in one or more VMs 2608 on top of the hardware 2604 and corresponds to the application 2602.

Figure 27:
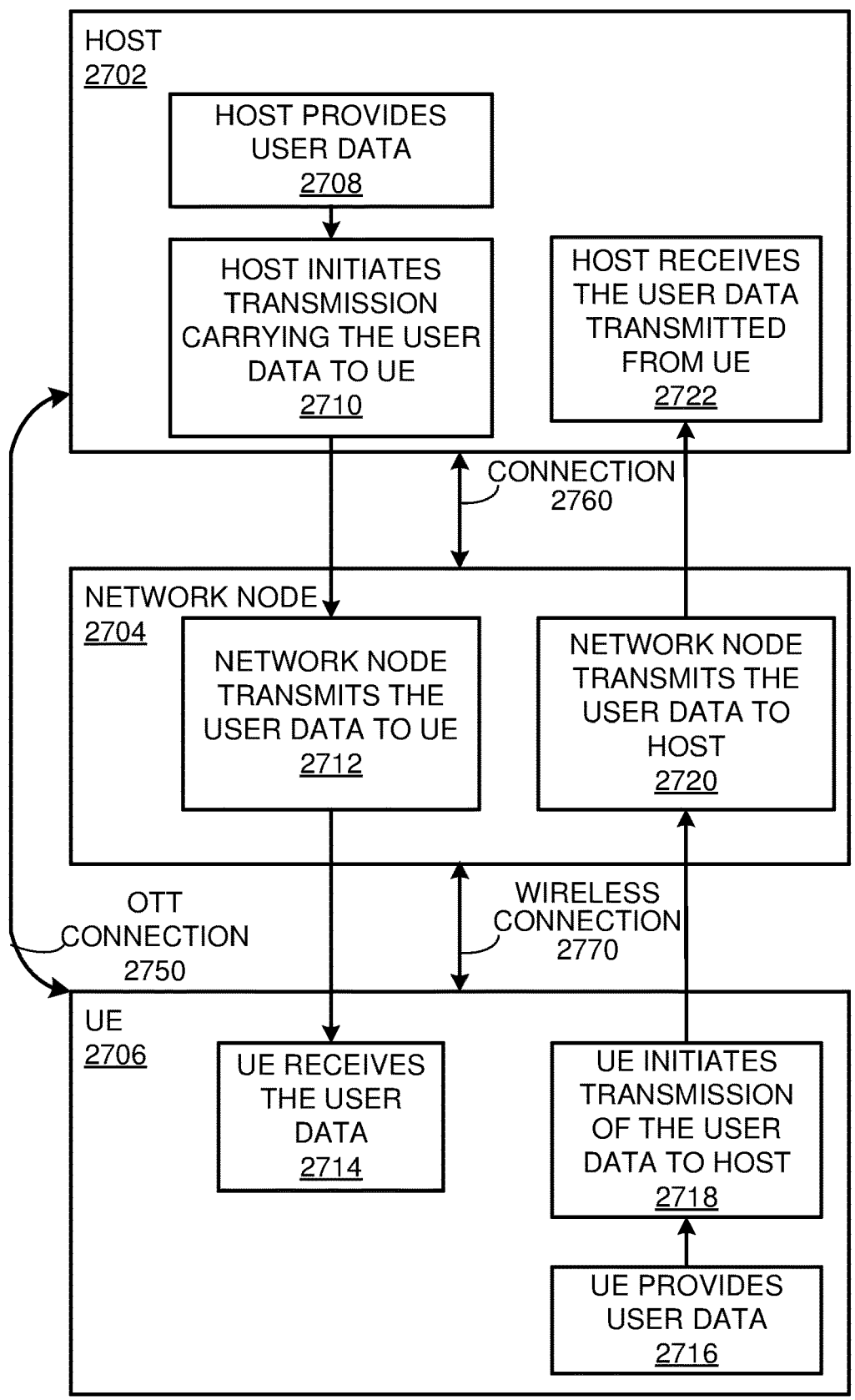
FIG. 27 is a block diagram of a host computer communicating via a base station with a user equipment over a partially wireless connection in accordance with some embodiments in accordance with some embodiments.

Hardware 2604 may be implemented in a standalone network node with generic or specific components. Hardware 2604 may implement some functions via virtualization. Alternatively, hardware 2604 may be part of a larger cluster of hardware (e.g. such as in a data center or CPE) where many hardware nodes work together and are managed via management and orchestration 2610, which, among others, oversees lifecycle management of applications 2602. In some embodiments, hardware 2604 is coupled to one or more radio units that each include one or more transmitters and one or more receivers that may be coupled to one or more antennas. Radio units may communicate directly with other hardware nodes via one or more appropriate network interfaces and may be used in combination with the virtual components to provide a virtual node with radio capabilities, such as a radio access node or a base station. In some embodiments, some signaling can be provided with the use of a control system 2612 which may alternatively be used for communication between hardware nodes and radio units. FIG. 27 shows a communication diagram of a host 2702 communicating via a network node 2704 with a UE 2706 over a partially wireless connection in accordance with some embodiments. Example implementations, in accordance with various embodiments, of the UE (such as a UE 2212a of FIG. 22 and/or UE 2300 of FIG. 23), network node (such as network node 2210a of FIG. 22 and/or network node 2400 of FIG. 24), and host (such as host 2216 of FIG. 22 and/or host 2500 of FIG. 25) discussed in the preceding paragraphs will now be described with reference to FIG. 27.

Like host 2500, embodiments of host 2702 include hardware, such as a communication interface, processing circuitry, and memory. The host 2702 also includes software, which is stored in or accessible by the host 2702 and executable by the processing circuitry. The software includes a host application that may be operable to provide a service to a remote user, such as the UE 2706 connecting via an over-the-top (OTT) connection 2750 extending between the UE 2706 and host 2702. In providing the service to the remote user, a host application may provide user data which is transmitted using the OTT connection 2750.

The network node 2704 includes hardware enabling it to communicate with the host 2702 and UE 2706. The connection 2760 may be direct or pass through a core network (like core network 2206 of FIG. 22) and/or one or more other intermediate networks, such as one or more public, private, or hosted networks. For example, an intermediate network may be a backbone network or the Internet.

The UE 2706 includes hardware and software, which is stored in or accessible by UE 2706 and executable by the UE's processing circuitry. The software includes a client application, such as a web browser or operator-specific "app" that may be operable to provide a service to a human or non-human user via UE 2706 with the support of the host 2702. In the host 2702, an executing host application may communicate with the executing client application via the OTT connection 2750 terminating at the UE 2706 and host 2702. In providing the service to the user, the UE's client application may receive request data from the host's host application and provide user data in response to the request data. The OTT connection 2750 may transfer both the request data and the user data. The UE's client application may interact with the user to generate the user data that it provides to the host application through the OTT connection 2750.

The OTT connection 2750 may extend via a connection 2760 between the host 2702 and the network node 2704 and via a wireless connection 2770 between the network node 2704 and the UE 2706 to provide the connection between the host 2702 and the UE 2706. The connection 2760 and wireless connection 2770, over which the OTT connection 2750 may be provided, have been drawn abstractly to illustrate the communication between the host 2702 and the UE 2706 via the network node 2704, without explicit reference to any intermediary devices and the precise routing of messages via these devices.

As an example of transmitting data via the OTT connection 2750, in step 2708, the host 2702 provides user data, which may be performed by executing a host application. In some embodiments, the user data is associated with a particular human user interacting with the UE 2706. In other embodiments, the user data is associated with a UE 2706 that shares data with the host 2702 without explicit human interaction. In step 2710, the host 2702 initiates a transmission carrying the user data towards the UE 2706. The host 2702 may initiate the transmission responsive to a request transmitted by the UE 2706. The request may be caused by human interaction with the UE 2706 or by operation of the client application executing on the UE 2706. The transmission may pass via the network node 2704, in accordance with the teachings of the embodiments described throughout this disclosure. Accordingly, in step 2712, the network node 2704 transmits to the UE 2706 the user data that was carried in the transmission that the host 2702 initiated, in accordance with the teachings of the embodiments described throughout this disclosure. In step 2714, the UE 2706 receives the user data carried in the transmission, which may be performed by a client application executed on the UE 2706 associated with the host application executed by the host 2702.

In some examples, the UE 2706 executes a client application which provides user data to the host 2702. The user data may be provided in reaction or response to the data received from the host 2702. Accordingly, in step 2716, the UE 2706 may provide user data, which may be performed by executing the client application. In providing the user data, the client application may further consider user input received from the user via an input/output interface of the UE 2706. Regardless of the specific manner in which the user data was provided, the UE 2706 initiates, in step 2718, transmission of the user data towards the host 2702 via the network node 2704. In step 2720, in accordance with the teachings of the embodiments described throughout this disclosure, the network node 2704 receives user data from the UE 2706 and initiates transmission of the received user data towards the host 2702. In step 2722, the host 2702 receives the user data carried in the transmission initiated by the UE 2706.

One or more of the various embodiments improve the performance of OTT services provided to the UE 2706 using the OTT connection 2750, in which the wireless connection 2770 forms the last segment. More precisely, the teachings of these embodiments may improve the decoding of signals and thereby provide benefits such as reducing delay, improving accuracy, and improving overall user experience In an example scenario, factory status information may be collected and analyzed by the host 2702. As another example, the host 2702 may process audio and video data which may have been retrieved from a UE for use in creating maps. As another example, the host 2702 may collect and analyze real-time data to assist in controlling vehicle congestion (e.g., controlling traffic lights). As another example, the host 2702 may store surveillance video uploaded by a UE. As another example, the host 2702 may store or control access to media content such as video, audio, VR or AR which it can broadcast, multicast or unicast to UEs. As other examples, the host 2702 may be used for energy pricing, remote control of non-time critical electrical load to balance power generation needs, location services, presentation services (such as compiling diagrams etc. from data collected from remote devices), or any other function of collecting, retrieving, storing, analyzing and/or transmitting data.

In some examples, a measurement procedure may be provided for the purpose of monitoring data rate, latency and other factors on which the one or more embodiments improve. There may further be an optional network functionality for reconfiguring the OTT connection 2750 between the host 2702 and UE 2706, in response to variations in the measurement results. The measurement procedure and/or the network functionality for reconfiguring the OTT connection may be implemented in software and hardware of the host 2702 and/or UE 2706. In some embodiments, sensors (not shown) may be deployed in or in association with other devices through which the OTT connection 2750 passes; the sensors may participate in the measurement procedure by supplying values of the monitored quantities exemplified above, or supplying values of other physical quantities from which software may compute or estimate the monitored quantities. The reconfiguring of the OTT connection 2750 may include message format, retransmission settings, preferred routing etc.; the reconfiguring need not directly alter the operation of the network node 2704. Such procedures and functionalities may be known and practiced in the art. In certain embodiments, measurements may involve proprietary UE signaling that facilitates measurements of throughput, propagation times, latency and the like, by the host 2702. The measurements may be implemented in that software causes messages to be transmitted, in particular empty or 'dummy' messages, using the OTT connection 2750 while monitoring propagation times, errors, etc.

Although the computing devices described herein (e.g., UEs, network nodes, hosts) may include the illustrated combination of hardware components, other embodiments may comprise computing devices with different combinations of components. It is to be understood that these computing devices may comprise any suitable combination of hardware and/or software needed to perform the tasks, features, functions and methods disclosed herein. Determining, calculating, obtaining or similar operations described herein may be performed by processing circuitry, which may process information by, for example, converting the obtained information into other information, comparing the obtained information or converted information to information stored in the network node, and/or performing one or more operations based on the obtained information or converted information, and as a result of said processing making a determination. Moreover, while components are depicted as single boxes located within a larger box, or nested within multiple boxes, in practice, computing devices may comprise multiple different physical components that make up a single illustrated component, and functionality may be partitioned between separate components. For example, a communication interface may be configured to include any of the components described herein, and/or the functionality of the components may be partitioned between the processing circuitry and the communication interface. In another example, non-computationally intensive functions of any of such components may be implemented in software or firmware and computationally intensive functions may be implemented in hardware.

In certain embodiments, some or all of the functionality described herein may be provided by processing circuitry executing instructions stored on in memory, which in certain embodiments may be a computer program product in the form of a non-transitory computer-readable storage medium. In alternative embodiments, some or all of the functionality may be provided by the processing circuitry without executing instructions stored on a separate or discrete device-readable storage medium, such as in a hard-wired manner. In any of those particular embodiments, whether executing instructions stored on a non-transitory computer-readable storage medium or not, the processing circuitry can be configured to perform the described functionality. The benefits provided by such functionality are not limited to the processing circuitry alone or to other components of the computing device, but are enjoyed by the computing device as a whole, and/or by end users and a wireless network generally.

Further definitions and embodiments are discussed below.

In the above-description of various embodiments of present inventive concepts, it is to be understood that the terminology used herein is for the purpose of describing particular embodiments only and is not intended to be limiting of present inventive concepts. Unless otherwise defined, all terms (including technical and scientific terms) used herein have the same meaning as commonly understood by one of ordinary skill in the art to which present inventive concepts belong. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When an element is referred to as being "connected", "coupled", "responsive", or variants thereof to another element, it can be directly connected, coupled, or responsive to the other element or intervening elements may be present. In contrast, when an element is referred to as being "directly connected", "directly coupled", "directly responsive", or variants thereof to another element, there are no intervening elements present. Like numbers refer to like elements throughout. Furthermore, "coupled", "connected", "responsive", or variants thereof as used herein may include wirelessly coupled, connected, or responsive. As used herein, the singular forms "a", "an" and "the" are intended to include the plural forms as well, unless the context clearly indicates otherwise. Well-known functions or constructions may not be described in detail for brevity and/or clarity. The term "and/or" (abbreviated "/") includes any and all combinations of one or more of the associated listed items.

It will be understood that although the terms first, second, third, etc. may be used herein to describe various elements/operations, these elements/operations should not be limited by these terms. These terms are only used to distinguish one element/operation from another element/operation. Thus a first element/operation in some embodiments could be termed a second element/operation in other embodiments without departing from the teachings of present inventive concepts. The same reference numerals or the same reference designators denote the same or similar elements throughout the specification.

As used herein, the terms "comprise", "comprising", "comprises", "include", "including", "includes", "have", "has", "having", or variants thereof are open-ended, and include one or more stated features, integers, elements, steps, components or functions but does not preclude the presence or addition of one or more other features, integers, elements, steps, components, functions or groups thereof. Furthermore, as used herein, the common abbreviation "e.g.", which derives from the Latin phrase "exempli gratia," may be used to introduce or specify a general example or examples of a previously mentioned item, and is not intended to be limiting of such item. The common abbreviation "i.e.", which derives from the Latin phrase "id est," may be used to specify a particular item from a more general recitation.

Example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

These computer program instructions may also be stored in a tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks. Accordingly, embodiments of present inventive concepts may be embodied in hardware and/or in software (including firmware, resident software, microcode, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts. Moreover, although some of the diagrams include arrows on communication paths to show a primary direction of communication, it is to be understood that communication may occur in the opposite direction to the depicted arrows.

Many variations and modifications can be made to the embodiments without substantially departing from the principles of the present inventive concepts. All such variations and modifications are intended to be included herein within the scope of present inventive concepts. Accordingly, the above disclosed subject matter is to be considered illustrative, and not restrictive, and the examples of embodiments are intended to cover all such modifications, enhancements, and other embodiments, which fall within the spirit and scope of present inventive concepts. Thus, to the maximum extent allowed by law, the scope of present inventive concepts are to be determined by the broadest permissible interpretation of the present disclosure including the examples of embodiments and their equivalents, and shall not be restricted or limited by the foregoing detailed description.

What is claimed is:

1. A method performed by a first network node in a wireless communications network, the method comprising:
receiving a first stream of bits;
generating a first stream of candidate codewords by deinterleaving the first stream of bits;
determining a validity of a first bit of a first candidate codeword in the first stream of candidate codewords using guessing random additive noise decoding, GRAND;
subsequent to determining the validity of the first bit of the first candidate codeword, generating a second stream of bits by re-interleaving the first stream of candidate codewords;
determining whether a second bit in the second stream of bits is a potential error bit based on a location of the second bit relative to a location of the first bit in the second stream of bits and the validity of the first bit;

subsequent to determining whether the second bit is a potential error bit, generating a second stream of candidate codewords by deinterleaving the second stream of bits;

changing a value of a third bit of the second stream of candidate codewords based on whether the second bit is a potential error bit; and subsequent to changing the value of the third bit, determining whether a second candidate codeword of the second stream of candidate codewords is within a threshold number of error bits from correct using GRAND, the second candidate codeword comprising the third bit.

2. The method of claim 1, wherein determining the validity of the first bit comprises determining that the first bit is an error bit and that the first candidate codeword has a single error bit.

3. The method of claim 1, wherein determining the validity of the first bit comprises:
   determining which candidate codewords in the first stream of candidate codewords are correct using syndrome computations;
   determining which candidate codewords in the first stream of candidate codewords have a single error bit using a single-error-correcting version of GRAND; and
   determining each of the single error bits including the first bit.

4. The method of claim 2, wherein the third bit is the second bit, and
   wherein determining whether the second bit is a potential error bit comprises determining that the second bit is a potential error bit based on at least one of:
      the second bit being within a threshold number of bit positions from the first bit;
      the second bit being between the first bit and another error bit; and
      the first stream being received via a block-fading channel and the second bit being part of the same block as the first bit.

5. The method of claim 1, wherein determining the validity of the first bit comprises determining that the first bit is a correct bit and that the first candidate codeword is correct.

6. The method of claim 5, wherein determining whether the second bit is a potential error bit comprises determining that the second bit is not a potential error bit based on at least one of:
   the second bit being within a threshold number of bit positions from the first bit;
   the second bit being between the first bit and another correct bit; and
   the first stream being received via a block-fading channel and the second bit being part of the same block as the first bit,
   the method further comprising:
      determining the third bit based on the third bit being separate from the first bit and the second bit.

7. The method of claim 1, wherein determining the validity of the first bit comprises determining a validity of a plurality of known bits in the first stream of candidate codewords,
   wherein determining whether the second bit is a potential error bit comprises determining whether a plurality of unknown bits in the second stream of bits are potential error bits based on a location of each unknown bit of the plurality of unknown bits in the second stream relative to a location of each known bit of the plurality of known bits in the second stream of bits and the validity of the plurality of known bits, and
   wherein changing the value of the third bit comprises changing a value of a portion of the plurality of unknown bits based on whether the unknown are potential error bits.

8. The method of claim 1, wherein determining whether the second candidate codeword of the second stream of candidate codewords is within the threshold number of error bits comprises determining that the second candidate codeword of the second stream of candidate codewords is within the threshold number of error bits from correct,
   the method further comprising:
      determining a validity of a fourth bit of the second candidate codeword in the second stream of candidate codewords using GRAND;
      subsequent to determining the validity of the fourth bit of the second candidate codeword, generating a third stream of bits by re-interleaving the second stream of candidate codewords;
      determining whether a fifth bit in the third stream of bits is a potential error bit based on a location of the fifth bit relative to a location of the fourth bit in the third stream of bits and the validity of the fourth bit;
      subsequent to determining whether the fifth bit is a potential error bit, generating a third stream of candidate codewords by deinterleaving the third stream of bits;
      changing a value of a sixth bit of the third stream of candidate codewords based on whether the fifth bit is a potential error bit; and
      subsequent to changing the value of the sixth bit, determining whether a third candidate codeword of the third stream of candidate codewords is within a second threshold number of error bits from correct using GRAND, the third candidate codeword comprising the sixth bit.

9. The method of claim 8, wherein determining the validity of the first bit comprises determining the validity of the first bit using a single-error guessing version of GRAND, and
   wherein determining the validity of the fourth bit comprises determining the validity of the fourth bit using a double-error version of GRAND.

10. The method of claim 1, wherein determining whether the second codeword of the second stream of candidate codewords is within the threshold number of error bits comprises determining that the second candidate codeword of the second stream of candidate codewords exceeds the threshold number of error bits from correct,
   the method further comprising:
      responsive to determining that the second candidate codeword of the second stream of candidate codewords exceeds the threshold number of error bits from correct, requesting at least a portion of first stream of bits that includes errors be resent.

11. The method of claim 1, wherein determining whether the second codeword of the second stream of candidate codewords is within the threshold number of error bits comprises determining that the second candidate codeword of the second stream of candidate codewords exceeds the threshold number of error bits from correct,
   the method further comprising:
      responsive to determining that the second candidate codeword of the second stream of candidate codewords exceeds the threshold number of error bits from correct, determining to switch from using GRAND to using another decoding process.

12. The method of claim 1, wherein determining the validity of the first bit comprises determining the validity of the first bit using a single-error guessing version of GRAND, and
wherein the threshold number of error bits comprises a single error bit.

13. The method of claim 1, wherein the wireless communications network is a 5th generation, 5G network, and
wherein the first network node comprises at least one of a radio access network node and a communication device.

14. A network node in a communications network, the network node comprising processing circuitry configured to:
receive a first stream of bits;
generate a first stream of candidate codewords by deinterleaving the first stream of bits;
determine a validity of a first bit of a first candidate codeword in the first stream of candidate codewords using guessing random additive noise decoding, GRAND;
subsequent to determining the validity of the first bit of the first candidate codeword, generate a second stream of bits by re-interleaving the first stream of candidate codewords;
determine whether a second bit in the second stream of bits is a potential error bit based on a location of the second bit relative to a location of the first bit in the second stream of bits and the validity of the first bit;
subsequent to determining whether the second bit is a potential error bit, generate a second stream of candidate codewords by deinterleaving the second stream of bits;
change a value of a third bit of the second stream of candidate codewords based on whether the second bit is a potential error bit; and
subsequent to changing the value of the third bit, determine whether a second candidate codeword of the second stream of candidate codewords is within a threshold number of error bits from correct using GRAND, the second candidate codeword comprising the third bit.

15. A non-transitory computer-readable medium having instructions stored therein that are executable by processing circuitry of a network node to cause the network node to perform operations, comprising:
receiving a first stream of bits;
generating a first stream of candidate codewords by deinterleaving the first stream of bits;
determining a validity of a first bit of a first candidate codeword in the first stream of candidate codewords using guessing random additive noise decoding, GRAND;
subsequent to determining the validity of the first bit of the first candidate codeword, generating a second stream of bits by re-interleaving the first stream of candidate codewords;
determining whether a second bit in the second stream of bits is a potential error bit based on a location of the second bit relative to a location of the first bit in the second stream of bits and the validity of the first bit;
subsequent to determining whether the second bit is a potential error bit, generating a second stream of candidate codewords by deinterleaving the second stream of bits;
changing a value of a third bit of the second stream of candidate codewords based on whether the second bit is a potential error bit; and
subsequent to changing the value of the third bit, determining whether a second candidate codeword of the second stream of candidate codewords is within a threshold number of error bits from correct using GRAND, the second candidate codeword comprising the third bit.

* * * * *